United States Patent

Kunita et al.

Patent Number: 5,939,465
Date of Patent: Aug. 17, 1999

[54] PHOTOPOLYMERIZABLE COMPOSITION

[75] Inventors: Kazuto Kunita; Yasuo Okamoto, both of Shizuoka, Japan

[73] Assignee: Fuji Photo Film Co., Ltd., Kanagawa, Japan

[21] Appl. No.: 08/903,058

[22] Filed: Jul. 30, 1997

[30] Foreign Application Priority Data

Jul. 31, 1996 [JP] Japan ................................ 8-202012

[51] Int. Cl.⁶ .................................................. G03F 7/038
[52] U.S. Cl. .............................. 522/31; 522/39; 522/60; 522/62; 522/63; 522/66; 522/67; 522/68; 522/126; 522/146; 522/167
[58] Field of Search .................................. 522/31, 39, 60, 522/62, 63, 66, 67, 68, 126, 146, 167

[56] References Cited

FOREIGN PATENT DOCUMENTS

A743896  2/1995  Japan .

*Primary Examiner*—Nathan M. Nutter
*Attorney, Agent, or Firm*—Burns, Doane, Swecker & Mathis, L.L.P.

[57] ABSTRACT

A photopolymerizable composition comprises (i) a compound represented by formula (I):

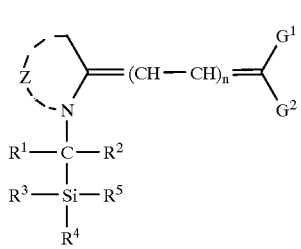

wherein $R^1$ and $R^2$ each independently represents a hydrogen atom, a cyano group, a substituted carbonyl group, a substituted or unsubstituted, alkyl group, aryl group, alkenyl group, or alkynyl group; $R^3$, $R^4$ and $R^5$ each independently represents a substituted or unsubstituted, alkyl group, aryl group, alkenyl group, or alkynyl group; Z represents a nonmetallic atom group necessary for forming a heterocyclic nucleus containing an N atom; n represents an integer of 0, 1 or 2; and $G^1$ and $G^2$ each independently represents a hydrogen atom, a cyano group, a substituted, carbonyl group, oxy group, amino group, thio group, sulfonyl group, sulfinyl group or an atomic group represented by formula (II) described in the specification, provided that $G^1$ and $G^2$ are not a hydrogen atom at the same time, (ii) a compound containing at least one addition-polymerizable, ethylenically unsaturated bond and (iii) a compound which generates an active radical upon irradiation of light in the presence of component (i) together.

5 Claims, No Drawings

PHOTOPOLYMERIZABLE COMPOSITION

FIELD OF THE INVENTION

The present invention relates to a photopolymerizable composition. More specifically, the present invention relates to a photopolymerizable composition comprising a photopolymerization initiation system of a novel composition having which is sensitive to visible light.

BACKGROUND OF THE INVENTION

Photopolymerizable compositions are materials which undergo changes in the physical properties of the composition as a result of a polymerization reaction induced by light irradiation. Photopolymerizable compositions are widely used in the fields of printing, printed circuit, fine working such as ultra LSI, painting, ink, hologram recording and three dimensional formation, and the application of such compositions is expanding. Photopolymerizable compositions fundamentally comprise an addition-polymerizable, ethylenically unsaturated compound and a photopolymerization initiator. This kind of composition polymerizes upon light irradiation and as a result, it is cured and insolubilized. When a binder resin having film forming ability and a thermal polymerization inhibitor or the like are added to a photopolymerizable composition and formed into a film, a desired cured image can be formed by irradiation of the film with light through a desired negative image and removal of the non-irradiated area by an appropriate solvent (hereinafter referred to simply as "development"). Such an image formation method is well known to be very useful in preparing a printing plate or the like.

Photopolymerization initiators conventionally used in photopolymerizable compositions include benzyl, benzoin ether, Michler's ketone, anthraquinone, acridine, phenazine and benzophenone. However, the composition comprising such a photopolymerization initiator is low in sensitizing rate and extremely poor in photopolymerization ability to visible light at 400 nm or more as compared with the photopolymerization ability to light in the ultraviolet wavelength region of 400 nm or less. Accordingly, the scope of application of a photopolymerizable composition comprising a conventional photopolymerization initiator is strictly limited.

A photosensitive composition which can be highly cured by irradiation with a small amount of light has long been in demand. Such a photosensitive composition is useful as a photosensitive material suitable, for example, for non-contact type projection exposure. Further, in recent years, an image information technique using a visible laser has come into a practical use, and a photosensitive composition having a high photopolymerization ability to visible light is keenly demanded. As a visible laser light, an $Ar^+$ laser light having a wavelength of 488 nm is promising. Further, energetic investigations have recently been made with a light source having a long wavelength, such as a YAG-SHG laser light having a wavelength of 532 nm and a He-Ne laser light having a wavelength of 543 nm.

With respect to a photopolymerizable composition comprising a photopolymerization initiation system sensitive to visible light, several proposals have been hitherto made. For example, U.S. Pat. No. 2,850,445 has reported that certain kinds of photosensitive dyes such as Rose Bengal, eosine and erythrosine exhibit effective sensitivity to visible light. Also, an improved technique has been reported using a composite initiation system comprising a dye and an amine (see, JP-B-44-20189 (the term "JP-B" as used herein means an "examined Japanese patent publication")), a system comprising a hexaarylbiimidazole, a radical generating agent and a dye (see JP-B-45-37377), a system comprising hexaarylbiimidazole and p-dialkylaminobenzylidene ketone (see JP-B-47-2528, JP-A-54-155292 (the term "JP-A" as used herein means an "unexamined published Japanese patent application")), a system comprising a 3-ketocoumarin compound and an active halogen compound (see JP-A-58-15503) and a system comprising a substituted triazine and a merocyanine dye (see JP-A-54-15102). These techniques are surely effective to visible light but the sensitivity achieved is not high and, in practical viewpoint, fails to reach a sufficiently satisfactory level. JP-A-2-244050 proposes a system comprising a dye having a 4-thiazolidinone skeleton and a radical generating agent as a highly sensitive initiation system. This system is surely highly sensitive, however, the sensitivity is still insufficient.

SUMMARY OF THE INVENTION

An object of the present invention is to provide, in a general and broad sense, a high-sensitive photopolymerizable composition, more specifically, a photopolymerizable composition comprising a photopolymerization initiator capable of increasing the photopolymerization rate of a photopolymerization composition containing an addition-polymerizable, ethylenically unsaturated compound.

Another object of the present invention is to provide a photopolymerizable composition containing a photopolymerization initiator having high sensitivity also to visible light at 400 nm or more, particularly to light at 488 nm corresponding to the output of an $Ar^+$ laser and further to light having a wavelength longer than 500 nm corresponding to the output of a YAG-SHG laser or a He-Ne laser, and at the same time having excellent aging stability.

As a result of extensive investigations to achieve the above-described objects, the present inventors have found that a photopolymerizable composition having a photopolymerization initiation system comprising a cyanine dye having specific substituents exhibits a very high photopolymerization rate and also high sensitivity even to visible light having a wavelength of 400 nm or more, and they have accomplished the present invention.

The present invention provides a photopolymerizable composition comprising the following components (i), (ii) and (iii):

(i) a compound represented by the following formula (I):

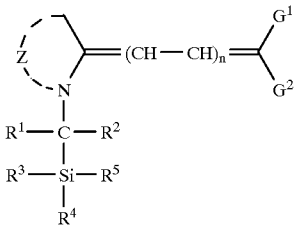
(I)

wherein R$^1$ and R$^2$, which may be the same or different, each represents a hydrogen atom, a cyano group, a substituted carbonyl group, a substituted or unsubstituted alkyl group, a substituted or unsubstituted aryl group, a substituted or unsubstituted alkenyl group or a substituted or unsubstituted alkynyl group; R$^3$, R$^4$ and R$^5$, which may be the same or different, each represents a substituted or unsubstituted alkyl group, a substituted or unsubstituted aryl group, a substituted or unsubstituted alkenyl group or a substituted or unsubstituted alkynyl group; Z represents a nonmetallic atom group necessary for forming a heterocyclic nucleus containing an N atom; n represents an integer of 0, 1 or 2; and G$^1$ and G$^2$, which may be the same or different, each represents a hydrogen atom, a cyano group, a substituted carbonyl group, a substituted oxy group, a substituted amino group, a substituted thio group, a substituted sulfonyl group, a substituted sulfinyl group or an atomic group represented by the following formula (II):

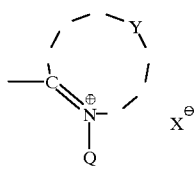
(II)

wherein Y represents a nonmetallic atom group necessary for forming a heterocyclic nucleus containing N$^+$; X$^-$ represents a counter anion to N$^+$; and Q represents a substituted or unsubstituted alkyl group, a substituted or unsubstituted aryl group, a substituted or unsubstituted alkenyl group or a substituted or unsubstituted alkynyl group, or Q may be a divalent linking group to bond to X$^-$, in which Q is a group resulting from removing a hydrogen atom from said group represented by Q, provided that G$^1$ and G$^2$ are not a hydrogen atom at the same time and that G$^1$ and G$^2$ may form a ring consisting of nonmetallic atoms together with the carbon atom to which G$^1$ and G$^2$ are bonded;

(ii) a compound containing at least one addition-polymerizable, ethylenically unsaturated bond; and (iii) a compound which generates an active radical upon irradiation of light in the presence of component (i).

DETAILED DESCRIPTION OF THE INVENTION

Each component of the photopolymerizable composition of the present invention is described in detail below.

Component (i) used in the present invention is a cyanine dye having specific substituents, represented by formula (I).

In formula (I), the alkyl group represented by R$^1$ or R$^2$ includes a linear, branched or cyclic alkyl group having from 1 to 20 carbon atoms, and examples thereof include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl and 2-norbornyl. Among these, preferred are a linear alkyl group having from 1 to 12 carbon atoms, a branched alkyl group having from 3 to 12 carbon atoms and a cyclic alkyl group having from 5 to 10 carbon atoms.

The substituent of the substituted alkyl group includes a monovalent nonmetallic atom group excluding a hydrogen atom, and preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido, group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and a conjugate base group thereof (hereinafter called a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alk ylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and a conjugate base group thereof (hereinafter called a phosphonato group), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and a conjugate base group thereof (hereinafter called an alkyl phosphonato group), a monoarylphosphono group (—PO$_3$H(aryl)) and a conjugate base group thereof (hereinafter called an aryl phosphonato group), a phosphonooxy group (—OPO$_3$H$_2$) and a conjugate base group thereof (hereinafter called a phosphonato oxy group), a dialkylphosphonooxy group (—OPO$_3$(alkyl)$_2$), a diarylphosphonooxy group (—OPO$_3$(aryl )$_2$)$_1$ an alkylarylphosphonooxy group (—OPO$_3$ (alkyl) (aryl)) a monoalkylphosphonooxy group (—OPO$_3$H(alkyl)) and a conjugate base group thereof (hereinafter called an alkyl phosphonato oxy group), a monoarylphosphonooxy group (—OPO$_3$H(aryl)) and a conjugate base group thereof (hereinafter called an aryl phosphonato oxy group), a cyano group, a nitro group, an aryl group, an alkenyl group and an alkynyl group.

Examples of the alkyl group in these substituents include the above-described alkyl groups and examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonato phenyl group, a phosphonophenyl group and a phosphonato phenyl group. Examples of the alkenyl group include a vinyl group, a 1-propenyl group, a 1-butenyl group, a cinnamyl group and a 2-chloro-1-ethenyl group, and examples of the alkynyl group include an ethynyl group, a 1-propynyl group, a 1-butynyl group and a trimethylsilylethynyl group. R$^6$ in the acyl group (R$^6$CO—) includes hydrogen and the above-described alkyl and aryl groups. Among these substituents, more preferred are a halogen atom (—F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonato oxy group, an aryl group and an alkenyl group.

The alkylene group in the substituted alkyl group includes a divalent organic residue resulting from eliminating any one of hydrogen atoms on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms. Specific preferred examples of the substituted alkyl group obtained by combining the substituent and the alkylene group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl) carbamoylethyl group, an N-methyl-N-(sulfophenyl) carbamoylmethyl group, a sulfobutyl group, a sulfonato butyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonato hexyl group, a diethylphosphonobutyl group, a diphenylphosphonopropyl group, a methylphosphonobutyl group, a methyl phosphonato butyl group, a tolylphosphonohexyl group, a tolyl phosphonato hexyl group, a phosphonooxypropyl group, a phosphonato oxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

The aryl group for R$^1$ and R$^2$ includes a condensed ring formed by from 1 to 3 benzene rings and a condensed ring formed by a benzene ring and a 5-membered unsaturated ring, and examples thereof include a phenyl group, a naphthyl group, an anthryl group, a phenanthryl group, an indenyl group, an acenaphthenyl group and a fluorenyl group, with the phenyl group and the naphthyl group being preferred.

The substituted aryl group includes those having a monovalent nonmetallic atom group exclusive of hydrogen as a substituent on the ring-forming carbon atoms of the above-described aryl group. Preferred examples of the substituent include the above-described alkyl groups, substituted alkyl groups and substituents for the substituted alkyl group. Preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyl-oxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonato phenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonato phenyl group, a diethylphosphonophenyl group, a diphenylphosphonophenyl group, a methylphosphonophenyl group, a methyl phosphonato phenyl group, a tolylphosphonophenyl group, a tolyl phosphonato phenyl group, an allyl group, a 1-propenylmethyl group, 2-butenyl group, a 2-methylallylphenyl group, a 2-methylpropenylphenyl group, a 2-propenylphenyl group, a 2-butynylphenyl group and a 3-butynylphenyl group.

The alkenyl group, the substituted alkenyl group, the alkynyl group and the substituted alkynyl group ($—C(R^7)=C(R^8)(R^9)$ and $—C\equiv C(R^{10})$) for $R^1$ and $R^2$ include those where $R^7$, $R^8$, $R^9$ and $R^{10}$ each represents a monovalent nonmetallic atom group. Preferred examples of $R^7$, $R^8$, $R^9$ and $R^{10}$ include a hydrogen atom, a halogen atom, an alkyl group, a substituted alkyl group, an aryl group and a substituted aryl group. Examples of these groups include those described above and more preferred examples of the substituent for $R^7$, $R^8$, $R^9$ and $R^{10}$ include a hydrogen atom, a halogen atom and linear, branched and cyclic alkyl groups each having from 1 to 10 carbon atoms.

Preferred examples of $R^1$ and $R^2$ as described above include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propynyl group and a phenylethynyl group.

More preferred examples of $R^1$ and $R^2$ include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, an allyl group, a 1-propenylmethyl group, a 2-butenyl group, a 2-methylallyl group, a 2-methylpropenyl group, a 2-propynyl group, a 2-butynyl group, a 3-butynyl group, a benzyl group, a phenethyl group, an α-methylbenzyl group, a 1-methyl-1-phenethyl group, a p-methylbenzyl group, a cinnamyl group, a hydroxyethyl group, a methoxyethyl group, a phenoxyethyl group, an allyloxyethyl group, a methoxyethoxyethyl group, an ethoxyethoxyethyl group, a morpholinoethyl group, a morpholinopropyl group, a sulfopropyl group, a sulfonato propyl group, a sulfobutyl group, a sulfonato butyl group, a carboxymethyl group, a carboxyethyl group, a carboxypropyl group, a methoxycarbonylethyl group, a 2-ethylhexyloxycarbonylethyl group, a phenoxycarbonylmethyl group, a methoxycarbonylpropyl group, an N-methylcarbamoylethyl group, an N,N-ethylaminocarbamoylmethyl group, an N-phenylcarbamoylpropyl group, an N-tolylsulfamoylbutyl group, a p-trienesulfonylaminopropyl group, a benzoylaminohexyl group, a phosphonomethyl group, a phosphonoethyl group, a phosphonopropyl group, a p-phosphonobenzylaminocarbonylethyl group, a phosphonato methyl group, a phosphonato propyl group, a phosphonato butyl group, a p-phosphonato benzylaminocarbonylethyl group, a vinyl group and an ethynyl group.

The substituted carbonyl group ($R^{11}—CO—$) for $R^1$ and $R^2$ includes those where $R^{11}$ is a monovalent nonmetallic atom group. Preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N-arylcarbamoyl group. The alkyl group and the aryl group in these groups include those described above for the alkyl group and the substituted alkyl group and those for the aryl group and the substituted aryl group, respectively. Among these, more preferred are a formyl group, an acyl group, a carboxyl group, an alkoxycarbonyl group, an aryloxycarbonyl group, a carbamoyl group, an N-alkylcarbamoyl group, an N,N-dialkylcarbamoyl group and an N-arylcarbamoyl group, still more preferred are a formyl group, an acyl group, an alkoxycarbonyl group and an aryloxycarbonyl group. Examples of preferred substituents include a formyl group, an acetyl group, a benzoyl group, a carboxyl group, a methoxycarbonyl group, an allyloxycarbonyl group, an N-methylcarbamoyl group, an N-phenylcarbamoyl group, an N,N-diethylcarbamoyl group and a morpholinocarbonyl group.

$R^1$ and $R^2$ each is more preferably a hydrogen atom, a cyano group, a substituted or unsubstituted alkyl group or a substituted carbonyl group.

$R^3$, $R^4$ and $R^5$ are described in detail below. The substituted or unsubstituted, alkyl group, aryl group, alkenyl group, and alkynyl group include those described above for $R^1$ and $R^2$.

Z is described in detail below. Z is a nonmetallic atom group necessary for forming an N atom-containing heterocyclic nucleus usually used in the cyanine dye. Examples of the heterocyclic ring containing Z and an N atom, which is usually used as the basic nucleus in the cyanine dye, include benzothiazoles (e.g., benzothiazole, 5-chlorobenzothiazole, 6-chlorobenzothiazole, 4-methylbenzothiazole, 6-methylbenzothiazole, 5-phenylbenzothiazole, 6-methoxybenzothiazole, 4-ethoxybenzothiazole, 4-hydroxybenzothiazole, 5,6-dimethylbenzothiazole, 5,6-dimethoxybenzothiazole), naphthothiazoles (e.g., α-naphthothiazole, β-naphthothiazole), benzoselenazoles (e.g., benzoselenazole, 5-chlorobenzoselenazole, 6-methylbenzoselenazole, 6-methoxybenzoselenazole), naphthoselenazoles (e.g., α-naphthoselenazole, β-naphthoselenazole), bnezoxazoles (e.g., benzoxazole, 5-methylbenzoxazole, 5-phenylbenzoxazole, 6-methoxybenzoxazole), naphthoxazoles (e.g., α-naphthoxazole, β-naphthoxazole), imidazoles (e.g., imidazole, benzimidazole), isoindoles (e.g., 3,3-dimethylindolenine), quinolines (e.g., quinoline, isoquinoline, 3-carboxyquinoline), diazoles (e.g., 1,3,4-oxadiazole, 1,3,4-thiadiazole, 1,3,4-selenadiazole), triazoles, pyrazine, quinoxaline, 5-triazine and phenathridine.

$G^1$ and $G^2$ are described in detail below.

The substituted carbonyl group includes those described above for $R^1$ and $R^2$.

The substituted oxy group ($R^{12}O—$) includes those where $R^{12}$ is a monovalent nonmetallic atom group exclusive of hydrogen. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonoxy group and a phosphonato oxy group. The alkyl group and the aryl group in these groups include those described above for the alkyl group and the substituted alkyl group and those for the aryl group and the substituted aryl group, respectively. The acyl group ($R^{13}CO—$) in the acyloxy group include those where $R^{13}$ is the alkyl group, substituted alkyl group, aryl group or substituted aryl group described above for $R^1$ and $R^2$. Among these substituents, more preferred are an alkoxy group, an aryloxy group, an acyloxy group and an arylsulfoxy group. Preferred examples of the substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonooxy group and a phosphonato oxy group.

The substituted thio group ($R^{14}S—$) includes those where $R^{14}$ is a monovalent nonmetallic atom group exclusive of hydrogen. Preferred examples of the substituted thio group include an alkylthio group, an arylthio group, an alkyldithio group, an aryldithio group and an acylthio group. The alkyl group and the aryl group in these groups include those described above for the alkyl group and the substituted alkyl group and those for the aryl group and the substituted aryl group, respectively. $R^{13}$ of the acyl group ($R^{13}CO—$) in the acylthio group is the same as described above. Among these, an alkylthio group and an arylthio group are more preferred. Preferred examples of the substituted thio group include a methylthio group, an ethylthio group, a phenylthio group, an ethoxyethylthio group, a carboxyethylthio group and a methoxycarbonylthio group.

The substituted amino group ($R^{15}NH—$, $(R^{16})(R^{17})N—$) includes those where $R^{15}$, $R^{16}$ and $R^{17}$ each is a monovalent nonmetallic atom group exclusive of hydrogen. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group. The alkyl group and the aryl group in these groups include those described above for the alkyl group and the substituted alkyl group and those for the aryl group and the substituted aryl group, respectively, and $R^{13}$ of the acyl group ($R^{13}CO—$) in the acylamino group, the N-alkylacylamino group and the N-arylacylamino group is the same as described above. Among these, more preferred are an N-alkylamino group, an N,N-dialkylamino group, an N-arylamino group and an acylamino group. Preferred examples of the substituted amino group include a methylamino group, an ethylamino group, a diethylamino group, a morpholino group, a piperidino group, a pyrrolidino group, a phenylamino group, a benzoylamino group and an acetylamino group.

The substituted sulfinyl group ($R^{18}—SO—$) includes those where $R^{18}$ is a monovalent nonmetallic atom group. Preferred examples thereof include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group and an N-alkyl-N-arylsulfinamoyl group. The alkyl group and the aryl group in these groups include those described above for the alkyl group and the substituted alkyl group and those for the aryl group and the substituted aryl group, respectively. Among these, more preferred are an alkylsulfinyl group and an arylsulfinyl group. Examples of the substituted sulfinyl group include a hexylsulfinyl group, a benzylsulfinyl group and a tolylsulfinyl group.

The substituted sulfonyl group ($R^{19}—SO_2—$) include those where $R^{19}$ is a monovalent nonmetallic atom group. More preferred examples thereof include an alkylsulfonyl group and an arylsulfonyl group. The alkyl group and the aryl group in these groups include those described above for the alkyl group and the substituted alkyl group and those for the aryl group and the substituted aryl group, respectively. Examples of the substituted sulfonyl group include a butylsulfonyl group and a chlorophenylsulfonyl group.

Among those described for $G^1$ and $G^2$, more preferred are a hydrogen atom, a cyano group, a substituted carbonyl group, a substituted oxy group and a substituted thio group.

The ring comprising nonmetallic atoms formed by $G^1$ and $G^2$ together with the carbon atom to which $G^1$ and $G^2$ are bonded is described in detail below.

Examples of the ring, which is usually used as an acidic nucleus in the merocyanine dye, include:

(a) a 1,3-dicarbonyl nucleus, e.g., 1,3-indandione, 1,3-cyclohexanedione, 5,5-dimethyl-1,3-cyclohexanedione, 1,3-dioxane-4,6-dione, (b) a pyrazolinone nucleus, e.g., 3-methyl-1-phenyl-2-pyrazolin-5-one, 1-phenyl-2-pyrazolin-5-one, 1-phenyl-2-pyrazolin-5-one, 1-(2-benzothiazolyl)-3-methyl-2-pyrazolin-5-one, (c) an isoxazolinone nucleus, e.g., 3-phenyl-2-isoxazolin-5-one, 3-methyl-2-isoxazolin-5-one, (d) an oxyindole nucleus, e.g., 1-alkyl-2,3-dihydro-2-oxyindole, (e) a 2,4,6-triketohexahydropyrimidine nucleus, e.g., a barbituric acid, a 2-thiobarbituric acid and derivatives thereof; examples of the derivative include a 1-alkyl form such as 1-methyl and 1-ethyl, a 1,3-dialkyl form such as 1,3-diethyl and 1,3-dibutyl, a 1,3-diaryl form such as 1,3-diphenyl, 1,3-di(p-chlorophenyl) and 1,3-di(p-ethoxycarbonylphenyl), and a 1-alkyl-3-aryl form such as 1-ethyl-3-phenyl, (f) a 2-thio-2,4-thiazolidinedione nucleus, e.g., rhodanine and a derivative thereof; examples of the derivative include 3-alkylrhodanine such as 3-ethylrhodanine and 3-allylrhodanine, and 3-arylrhodanine such as 3-phenylrhodanine, (g) a 2-thio-2,4-oxazolidinedione (2-thio-2,4-(3H,5H) oxazoledione) nucleus, e.g., 2-ethyl-2-thio-2,4-oxazolidinedione, (h) a thianaphthenone nucleus, e.g., 3(2H)-thianaphtenone, 3(2H)-thianaphthenone-1,1-dioxide, (i) a 2-thio-2,5-thiazolidinedione nucleus, e.g., 3-ethyl-2-thio-2,5-thiazolidinedione, (j) a 2,4-thiazolidinedione nucleus, e.g., 2,4-thiazolidinedione, 3-ethyl-2,4-thiazolidinedione, 3-phenyl-2,4-thiazolidinedione, (k) a thiazolidinone nucleus, e.g., 4-thiazolidinone, 3-ethyl-4-thiazolidinone, (l) a 4-thiazolinone nucleus, e.g., 2-ethylmercapto-5-thiazolin-4-one, 2-alkylphenylamino-5-thiazolin-4-one, (m) a 2-imino-2-oxazolin-4-one(pseudo-hydantoin) nucleus, (n) a 2,4-imidazolidinedione(hydantoin) nucleus, e.g., 2,4-imidazolidinedione, 3-ethyl-2,4-imidazolidinedione, (o) a 2-thio-2,4-imidazolidinedione(2-thiohydantoin) nucleus, e.g., 2-thio-2,4-imidazolidinedione, 3-ethyl-2-thio-2,4-imidazolidinedione, (p) a 2-imidazolin-5-one nucleus, e.g., 2-n-propylmercapto-2-imidazolin-5-one, (q) a furan-5-one, (r) a 4-hydroxy-2(1H)-quinolinone nucleus or a 4-hydroxy-2(1H)-pyridinone nucleus, e.g., N-methyl-4-hydroxy-2(1H)-quinolinone, N-n-butyl-4-hydroxy-2 (1H)-quinolinone, N-methyl-4-hydroxy-2(1H)-pyridinone, (s) a substituted or unsubstituted 4-hydroxy-2H-pyran-2-one, e.g., 4-hydroxycoumarin, and (t) a substituted or unsubstituted thioindoxyl, e.g., 5-methylthioindoxyl.

Y is described in detail below. Y is a nonmetallic atom group necessary for forming a heterocyclic nucleus containing an N atom, which is usually used in the cyanine dye. This heterocyclic ring containing Y and $N^+$ is usually used as an acidic nucleus in the cyanine nucleus and includes those obtained by newly introducing a substituent Q onto the N atom of the heterocyclic ring described above for Z.

Q is described in detail below. When Q is a monovalent substituent, the substituted or unsubstituted, alkyl group, aryl group, alkenyl group, and alkynyl group for Q include those described above for $R^1$ and $R^2$.

When Q is a divalent linking group bonded to $X^-$, examples of Q include those resulting from removing one H atom from the above-described Q as a monovalent substituent, more specifically, Q represents a substituted or unsubstituted, alkylene group, arylene group, alkenylene group, or alkynylene group.

$X^-$ is described in detail below. $X^-$ is an anion of acid and includes $Cl^-$, $Br^-$, $I^-$, $^-SCN$, $ClO_{4-}$, $PF_6^-$, $BF_4^-$, $SbF_6^-$, $CF_3SO_3^-$, $HSO_4^-$, $CH_3SO_3^-$, $C_2H_5SO_3^-$ and $C_6H_4^-$.

The case where Q and $X^-$ are linked is described in detail below. Examples thereof include $-CH_2CH_2CH_2SO_3^-$, $-CH_2CH_2CH_2CH_2SO_3^{31}$, $C_6H_5-SO_3^-$, $-CH=CH-SO_3^-$ and $-CH\equiv C-SO_3^-$.

Examples of the compound represented by formula (I) for use in the present invention are set forth below, however, the present invention is by no means limited thereto.

No. 1

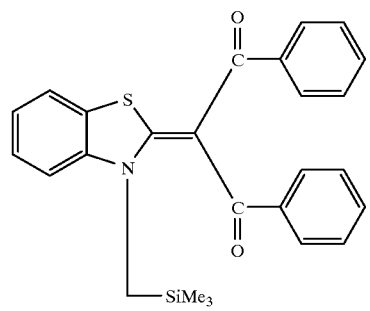

-continued
No. 2
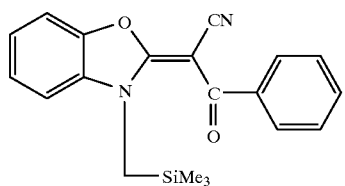
No. 3
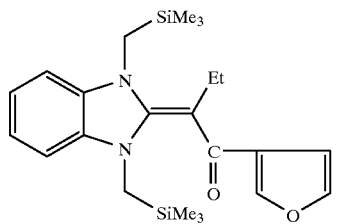
No. 4
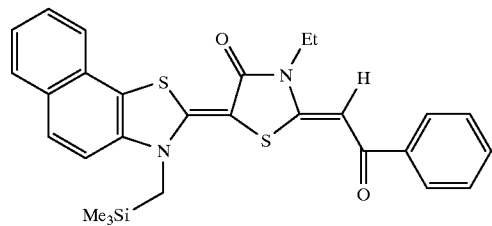
No. 5
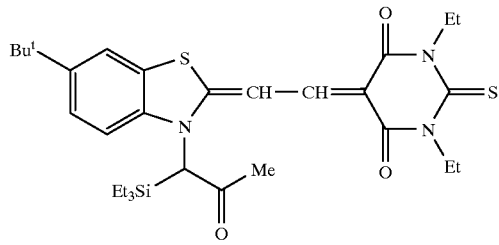
No. 6
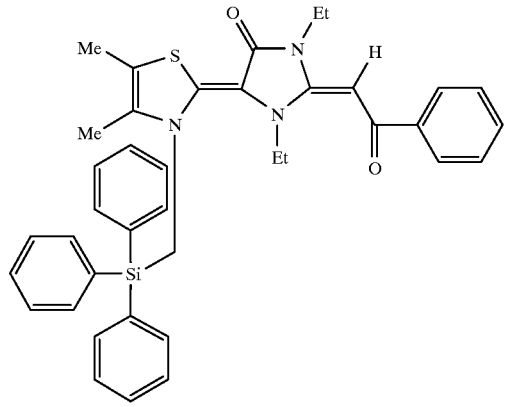

No. 7
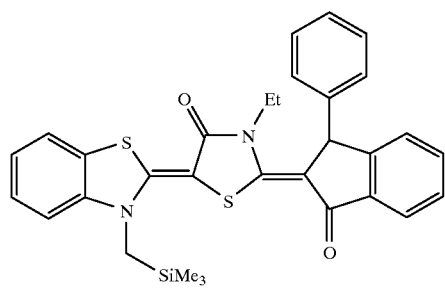
No. 8
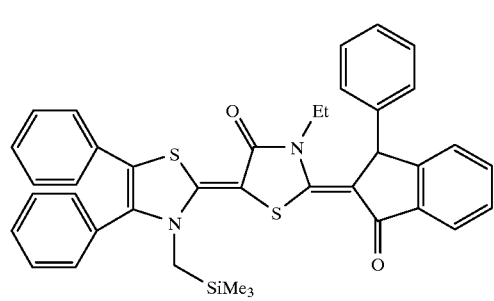
No. 9
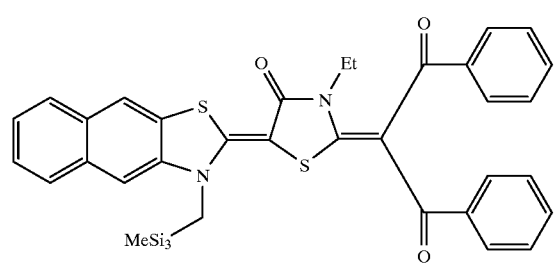
No. 10
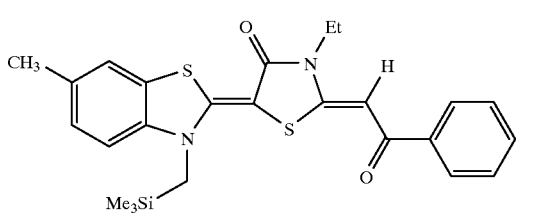
No. 11
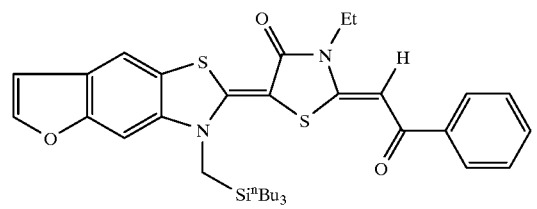
No. 12
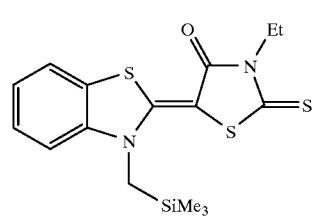

-continued
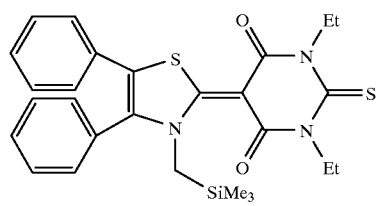
No. 13
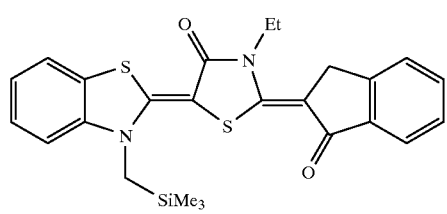
No. 14
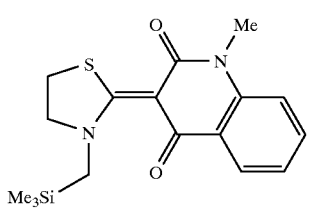
No. 15
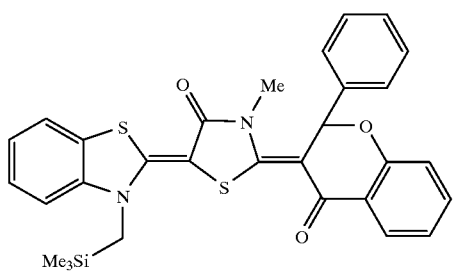
No. 16
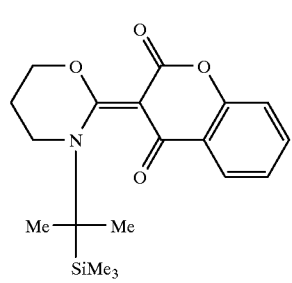
No. 17
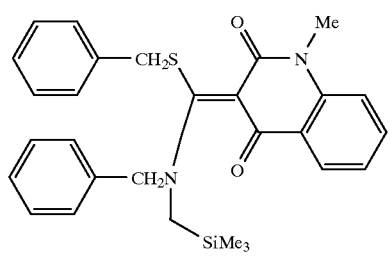
No. 18

-continued
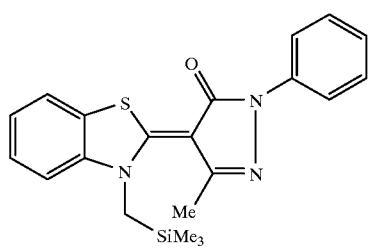
No. 19
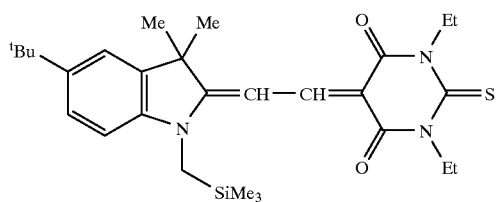
No. 20
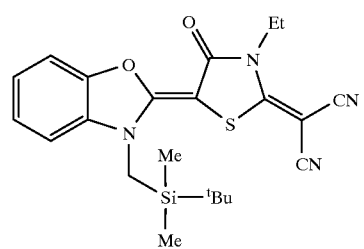
No. 21
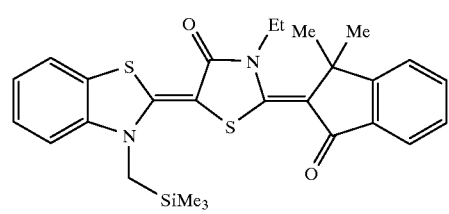
No. 22
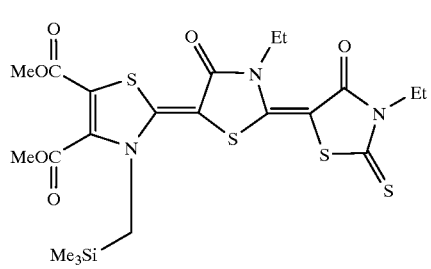
No. 23
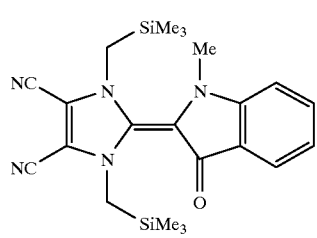
No. 24

-continued
No. 25
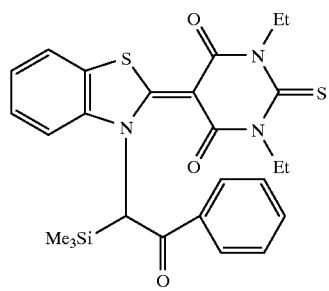
No. 27
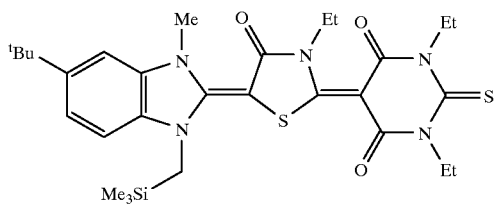
No. 28
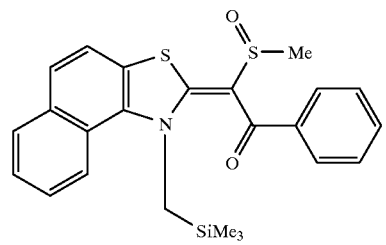
No. 29
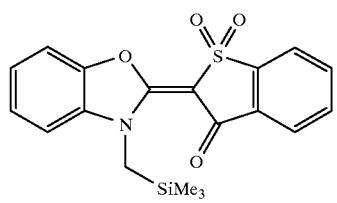
No. 30
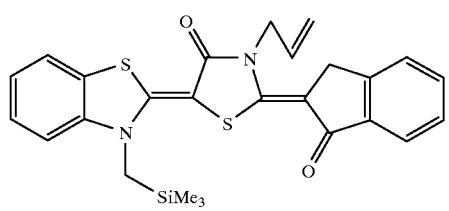
No. 31
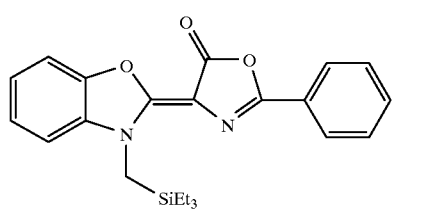

-continued
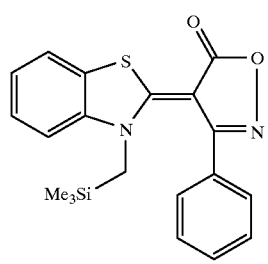
No. 32
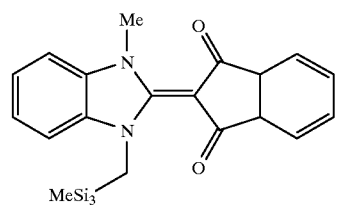
No. 33
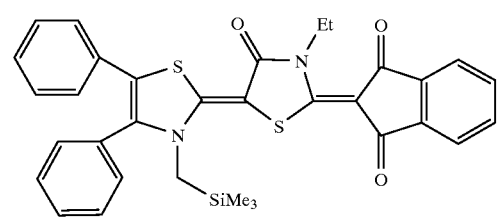
No. 34
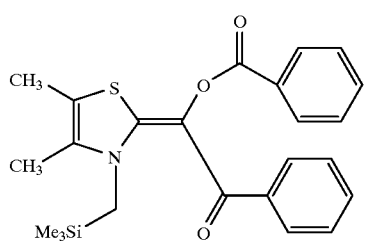
No. 35
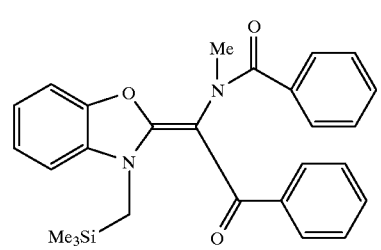
No. 36
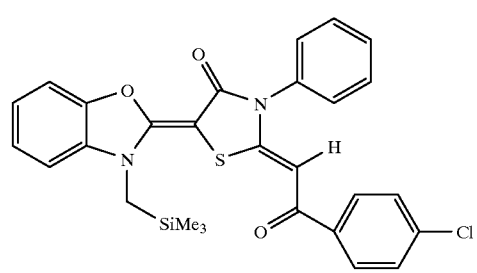
No. 37

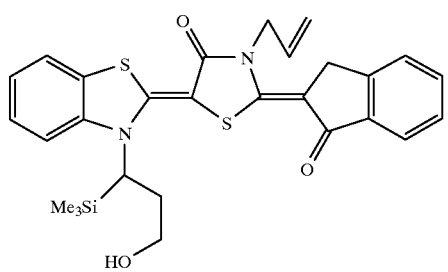
No. 38
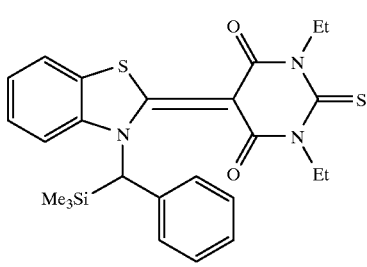
No. 39
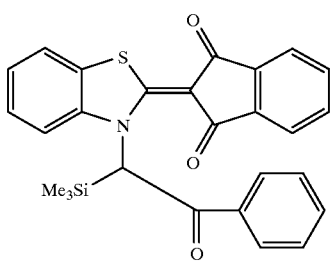
No. 40
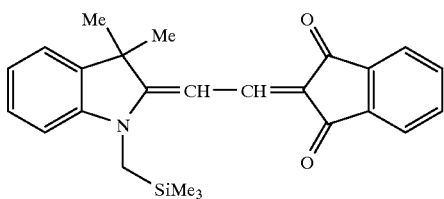
No. 41
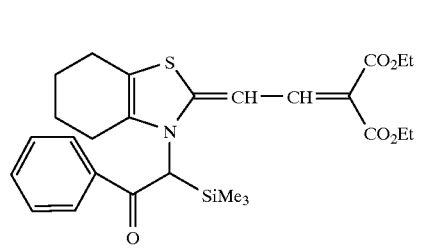
No. 42
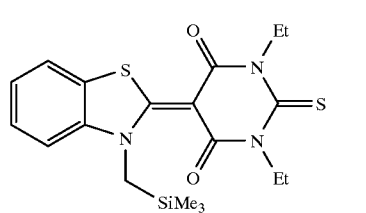
No. 43

No. 44
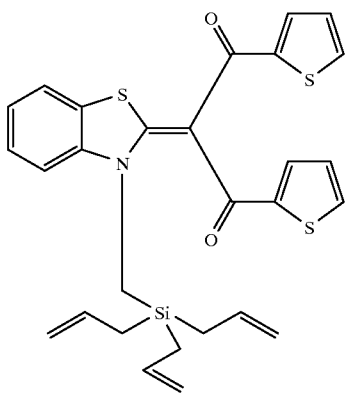
No. 45
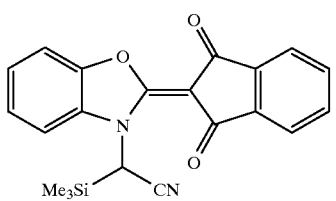
No. 46
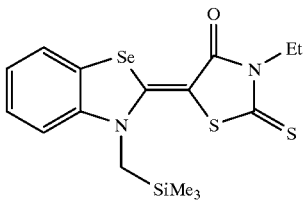
No. 47
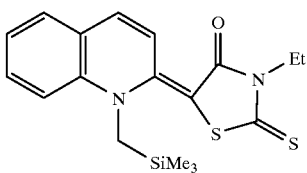
No. 48
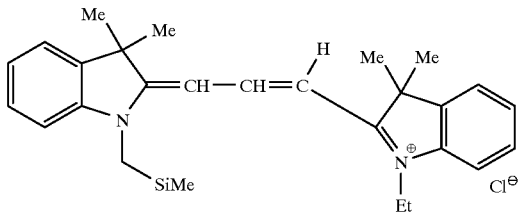
No. 49
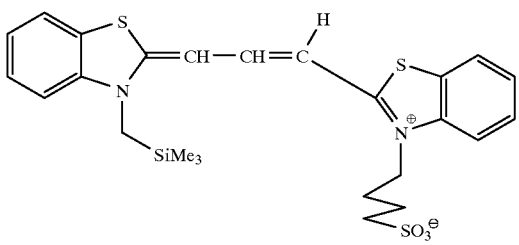

-continued

No. 50

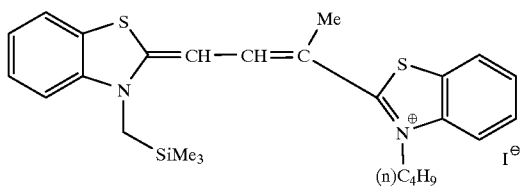

No. 51

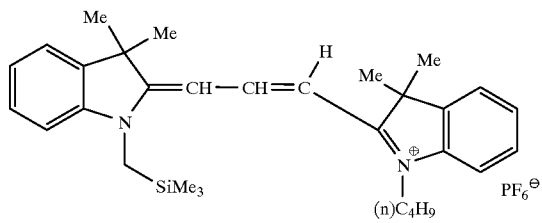

No. 52

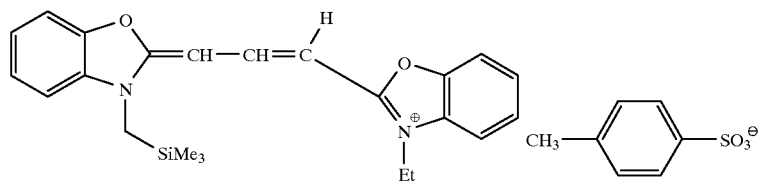

In formulae of the above-described specific examples, Me indicates a methyl group, Et indicates an ethyl group, $^tBu$ indicates a tert-butyl group, and Ph indicates a phenyl group.

The compound group represented by the following formula (I) for use in the present invention is synthesized, for example, by the methods described below.

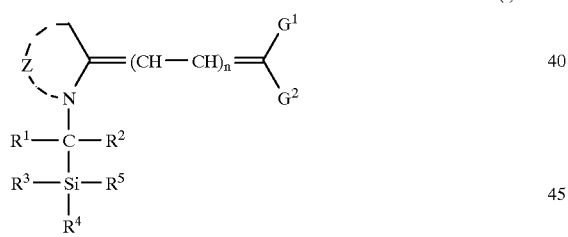
(I)

(1) When n in formula (I) is 0:

The compound can be synthesized using Starting Material 1 which can be synthesized by the method described, for example, in ALANR KATRITZKY et al, *COMPREHENSIVE HETEROCYCLIC CHEMISTRY*, Vol. 6, pp. 293–327 (1984). Specifically, the synthesis route is shown in Scheme 1 below.

Scheme 1

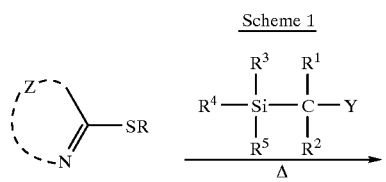

-continued

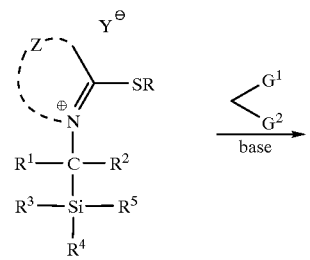

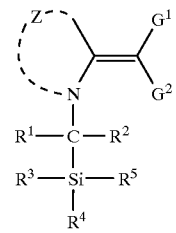

(wherein R is an alkyl group such as Me or Et, $Y^-$ is $Cl^-$, $Br^-$, $I^-$, $CF_3SO_3^-$ or $CH_3-C_6H_4-SO_3^-$).

(2) When n in formula (I) is 1 or 2:

The compound can be synthesized by the method described, for example, in F. M. Hamer et al., *The Cyanine Dyes and Related Compounds*, pp. 511–611 (1964).

Specifically, the synthesis route is shown in Scheme 2 below.

Scheme 2

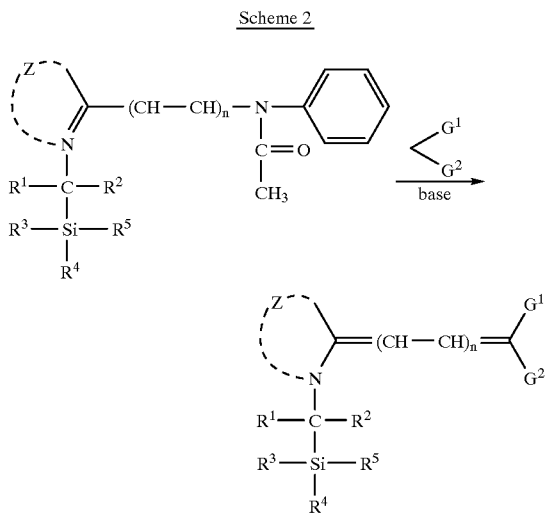

As the base in Scheme 1 and Scheme 2, a base commonly used for general purpose can be suitably used and examples thereof include organic amine, pyridines (e.g., trialkylamine, dimethylaminopyridine), metal amides (e.g., lithium diisopropylamide), metal alkoxides (e.g., sodium methoxide, potassium t-butoxide) and metal hydrides (e.g., sodium hydride).

The synthesis method of the compound represented by formula (I) is not limited to those described above.

$G^1$ and $G^2$ can be subjected to synthetic modification into $G^3$ and $G^4$ (having the same meanings as $G^1$ and $G^2$). Specifically, the synthetic route is shown in Scheme 3.

Scheme 3

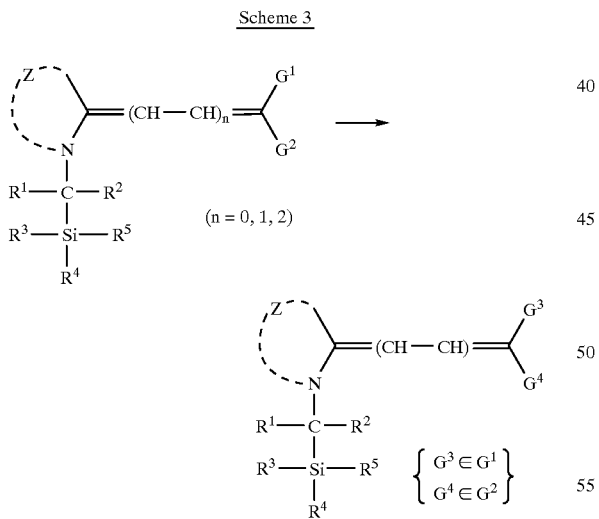

The compounds represented by formula (I) for use in the photopolymerizable composition of the present invention may be suitably used individually or in combination of two or more thereof.

The compound having at least one addition-polymerizable, ethylenically unsaturated bond as component (ii) used in the present invention is selected from the compounds having at least one, preferably two or more ethylenically unsaturated bonds on the terminal(s).

The compound has a chemical form such as a monomer, a prepolymer, more specifically, a dimer, a trimer or an oligomer, a mixture thereof or a copolymer thereof. Examples of the monomer and the copolymer thereof include esters of an unsaturated carboxylic acid (e.g., acrylic acid, methacrylic acid, itaconic acid, crotonic acid, isocrotonic acid, maleic acid) with an aliphatic polyhydric alcohol compound and amides of an unsaturated carboxylic acid with an aliphatic polyhydric amine compound.

Examples of the ester monomer of an aliphatic polyhydric alcohol compound with an unsaturated carboxylic acid include: as the acrylic ester, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer;

as the methacrylic ester, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane;

as the itaconic ester, ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;

as the crotonic ester, ethylene glycol dicrotonate, tetramethylene glycol dicrotonate, pentaerythritol dicrotonate and sorbitol tetradicrotonate;

as the isocrotonic ester, ethylene glycol diisocrotonate, pentaerythritol diisocrotonate and sorbitol tetraisocrotonate;

as the maleic ester, ethylene glycol dimaleate, triethylene glycol dimaleate, pentaerythritol dimaleate and sorbitol tetramaleate; and a mixture of the above-described ester monomers.

Examples of the amide monomer of an aliphatic polyhydric amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other examples include a vinyl urethane compound having two or more polymerizable vinyl groups in one molecule resulting from the addition of a vinyl monomer having a hydroxyl group represented by the following formula (J) to a polyisocyanate compound having two or more isocyanate groups in one molecule described in JP-B-48-41708:

$CH_2=C(R)COOCH_2CH(R')OH$ (J)

(wherein R and R' each represents H or $CH_3$).

Also, polyfunctional acrylates and methacrylates such as urethane acrylates described in JP-A-51-37193, polyester acrylates described in JP-A-48-64183, JP-B-49-43191 and JP-B-52-30490 and epoxy acrylates resulting from the reaction of an epoxy resin with a (meth)acrylic acid are included. Further, those described as a photocurable monomer or oligomer in Nippon Secchaku Kyokaishi (Journal of Japan Adhesive Society), Vol. 1, 20, No. 7, pp. 300–308 (1984) may be used. The compound is used in an amount of from 5 to 70% by weight (hereinafter referred to simply as "%"), preferably from 10 to 55%, based on the entire components.

The component (iii) for use in the present invention is described in detail below. The compound as component (iii) for use in the present invention may be any as long as it produces an active radical upon light irradiation in the presence of component (i) together. More specifically, compounds which produce an active radical through an interaction (e.g., energy transfer, electron transfer, production of excited complex) with component (i) excited by the light irradiation can be suitably used. Examples of preferred activators include (a) a compound having a carbon halogen bond, (b) an aromatic onium salt compound, (c) an organic peroxide compound, (d) a thio compound, (e) a hexaarylbiimidazole compound, (f) a ketooxime ester compound, (g) a borate compound, (h) an azinium compound, (i) a metallocene compound and (j) an active ester compound.

Preferred examples of the compound having a carbon halogen bond as one example of component (iii) include those represented by the following formulae (III), (IV), (V), (VI), (VII), (VIII) and (IX):

a compound represented by formula (III):

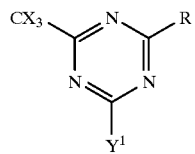

(III)

wherein X represents a halogen atom, $Y^1$ represents $—CX'_3$, $—NH_2$, $—NHR'$, $—NR'_2$ or $—OR'$ (wherein R' represents an alkyl group, a substituted alkyl group, an aryl group or a substituted aryl group) and R represents $—CX_3$, an alkyl group, a substituted alkyl group, an aryl group, a substituted aryl group or a substituted alkenyl group;

a compound represented by formula (IV):

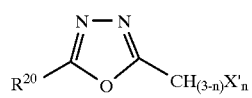

(IV)

wherein $R^{20}$ represents an alkyl group, a substituted alkyl group, an alkenyl group, a substituted alkenyl group, an aryl group, a substituted aryl group, a halogen atom, an alkoxy group, a substituted alkoxyl group, a nitro group or a cyano group, X' represents a halogen atom, and n represents an integer of from 1 to 3;

a compound represented by formula (V):

$R^{21}—Z'—CH_{(2-m)}X''_m—R^{22}$ (V)

wherein $R^{21}$ represents an aryl group or a substituted aryl group, and $R^{22}$ represents $—C(=O)—NR^{23}R^{24}$, $—C(=S)NR^{23}R^{24}$,

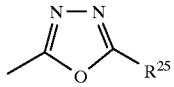

or a halogen, Z' represents $—C(=O)—$, $—C(=S)—$ or $—SO_2—$ (wherein $R^{23}$ and $R^{24}$ each represents an alkyl group, a substituted alkyl group, an alkenyl group, a substituted alkenyl group, an aryl group or a substituted aryl group, and $R^{25}$ has the same meaning as R' in formula (III)), x" represents a halogen atom, and m represents 1 or 2;

a compound represented by formula (VI):

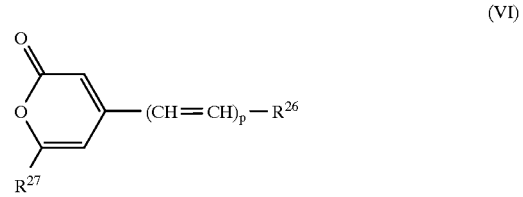

(VI)

wherein $R^{26}$ represents an aryl group or a heterocyclic group, which may be substituted, $R^{27}$ represents a trihaloalkyl or trihaloalkenyl group having from 1 to 3 carbon atoms, and p represents 1, 2 or 3;

a carbonylmethylene heterocyclic compound having a trihalogenomethyl group, represented by formula (VII):

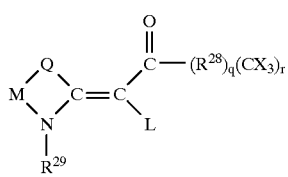

(VII)

wherein L represents a hydrogen atom or a substituent represented by the formula: $CO—(R^{28})_q(CX_3)_r$, Q represents a sulfur atom, a selenium atom, an oxygen atom, a dialkylmethylene group, an alken-1,2-ylene group, 1,2-phenylene group or an N-R group, M represents a substituted or unsubstituted alkylene or alkenylene group or a 1,2-arylene group, $R^{29}$ represents an alkyl group, an aralkyl group or an alkoxyalkyl group, $R^{28}$ represents a carbocyclic or heterocyclic divalent aromatic group, X represents a chlorine atom, a bromine atom or an iodine atom, and q=0 and r=1 or q=1 and r=1 or 2;

a 4-halogeno-5-(halogenomethylphenyl)oxazole derivative represented by formula (VIII):

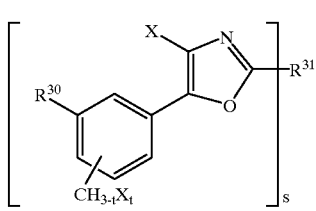

(VIII)

wherein X represents a halogen atom, t represents an integer of from 1 to 3, s represents an integer of from 1 to 4, $R^{30}$ represents a hydrogen atom or a $CH_{3-t}X_t$ group, and $R^{31}$ represents an s-valent unsaturated organic group which may be substituted; and a 2-(halogenomethylphenyl)-4-halogenooxazole derivative represented by formula (IX):

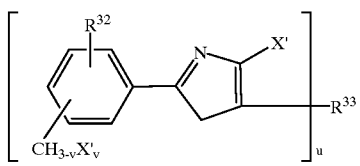

(IX)

wherein X' represents a halogen atom, v represents an integer of from 1 to 3, u represents an integer of from 1 to 4, $R^{32}$ represents a hydrogen atom or a $CH_{3-v}X'_v$ group and $R^{33}$ represents a u-valent unsaturated organic group which may be substituted.

Specific examples of the compound having a carbon-halogen bond include:

compounds described, for example, in Wakabayashi et al., Bull. Chem. Soc. Japan, 42, 2924 (1969), such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine;

compounds described in British Patent 1,388,492, such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine;

compounds described in JP-A-53-133428, such as 2-(4-methoxynaphtho-1-yl)-4,6-bis-trichloromethyl-S-triazine, 2-(4-ethoxynaphtho-1-yl)-4,6-bis-trichloromethyl-S-triazine, 2-[4-(2-ethoxyethyl) naphtho-1-yl]-4,6-bis-trichloromethyl-S-triazine, 2-(4,7-dimethoxynaphtho-1-yl)-4,6-bis-trichloromethyl-S-triazine and 2-(acenaphtho-5-yl)-4,6-bis-trichloromethyl-S-triazine;

compounds described in German Patent No. 3,337,024, such as

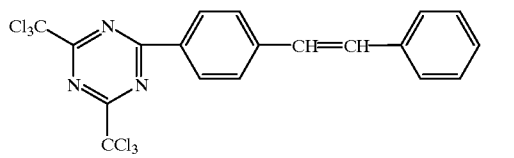

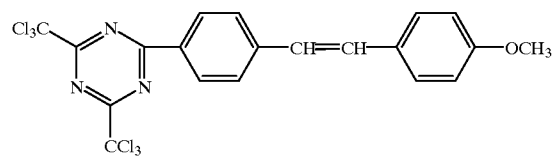

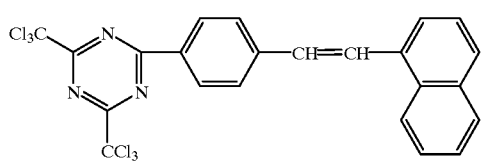

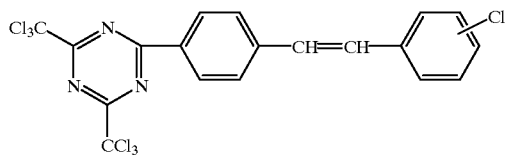

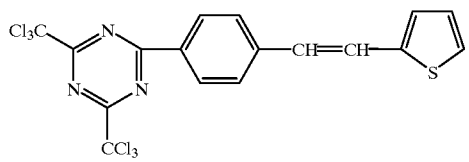

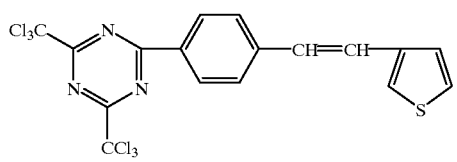

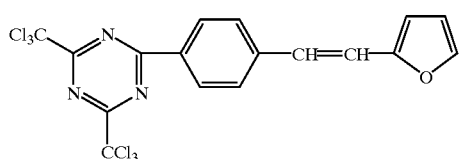

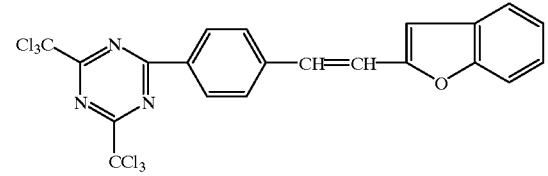

compounds described in F. C. Schaefer et al., J. Org. Chem., 29, 1527 (1964), such as 2-methyl-4,6-bis (tribromomethyl)-S-triazine, 2,4,6-tris (tribromomethyl)-S-triazine, 2,4,5-tris (dibromomethyl)-S-triazine, 2-amino-4-methyl-6-tribromomethyl-S-triazine and 2-methoxy-4-methyl-6-trichloromethyl-S-triazine;

compounds described in JP-A-62-58241, such as
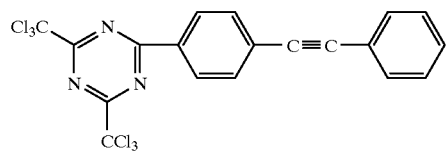
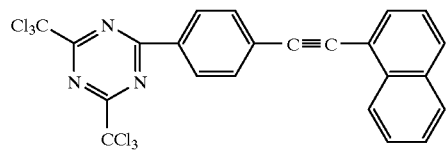
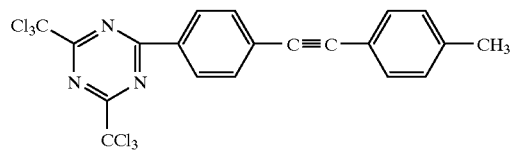
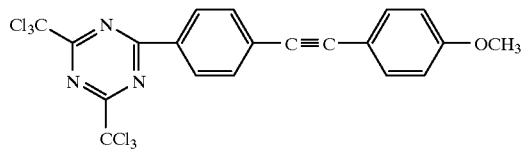
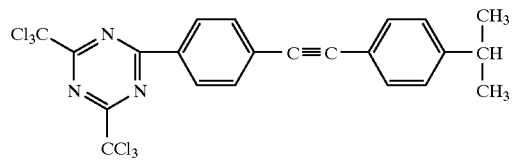
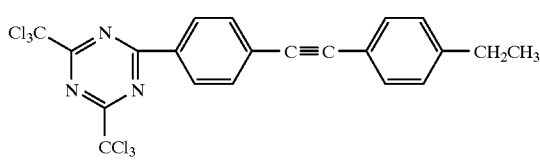
compounds described in JP-A-5-281728, such as
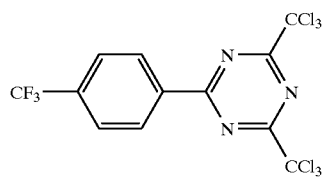
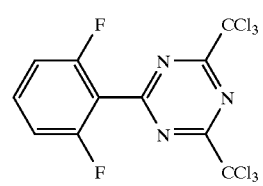
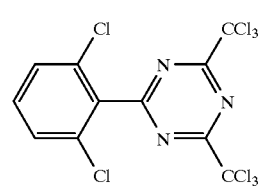
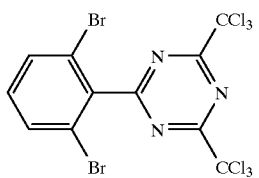
compounds described below which can be easily synthesized by a person skilled in the art according to the synthesis methods described in M. P. Hutt, E. F. Elslager and L. M. Merbel, *Journal of Heterocyclic Chemistry*, Vol. 7. (No. 3), page 511 et seq (1970):
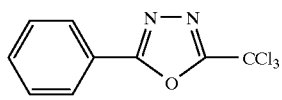
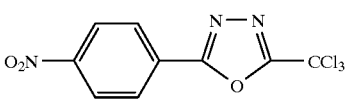
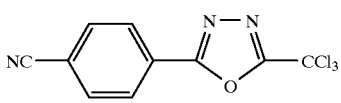
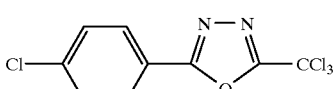
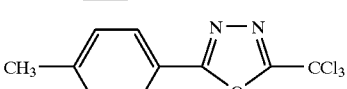
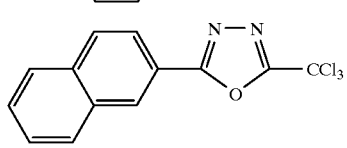
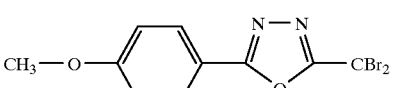
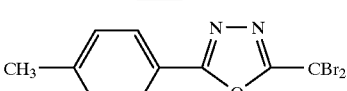
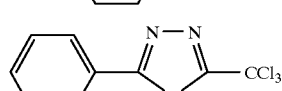
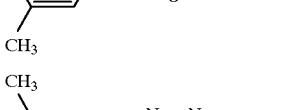
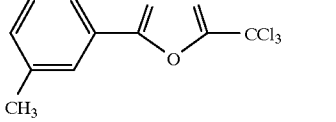
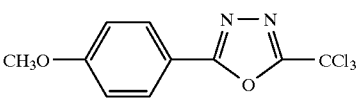

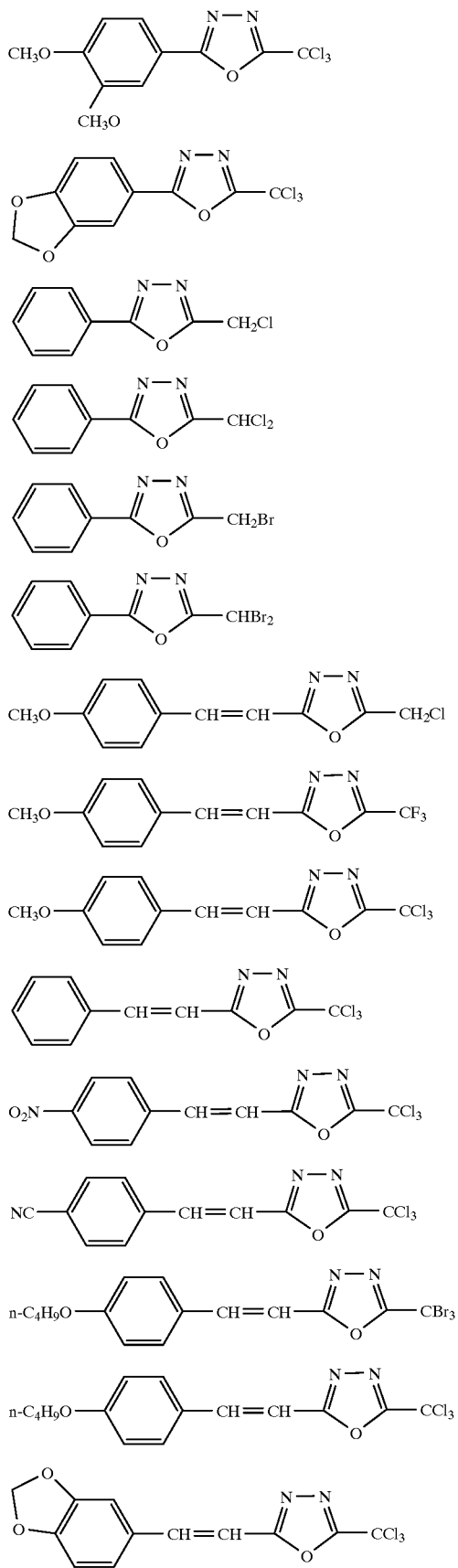
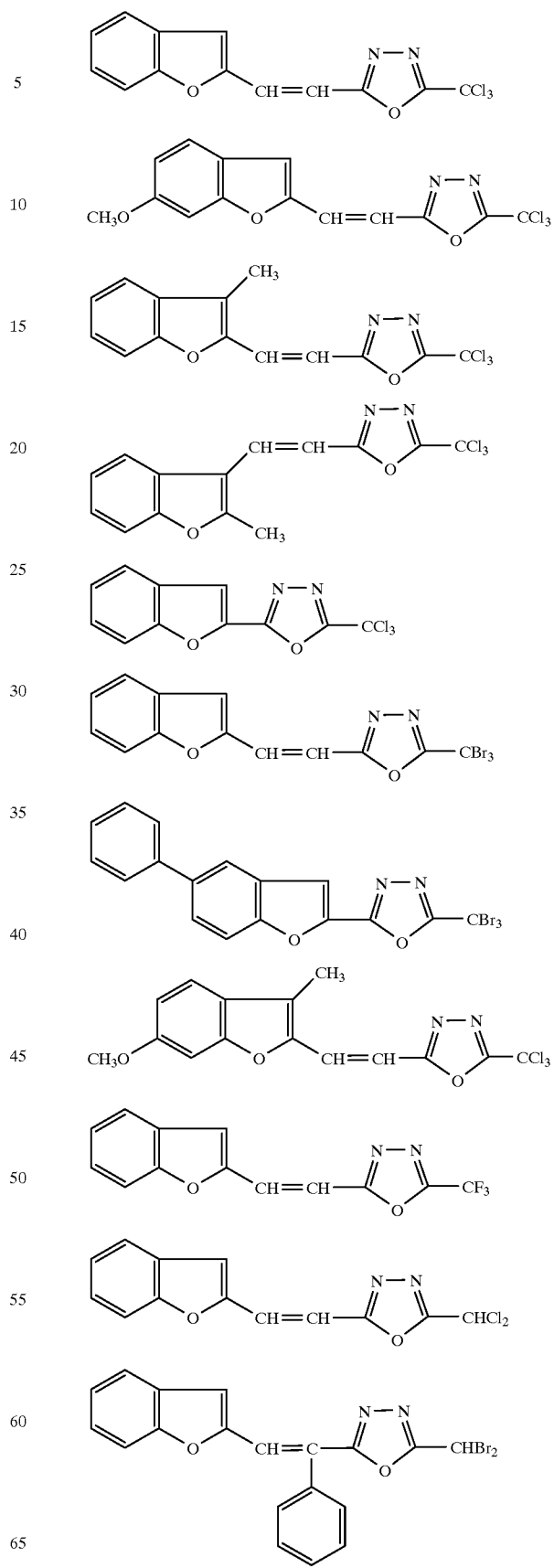

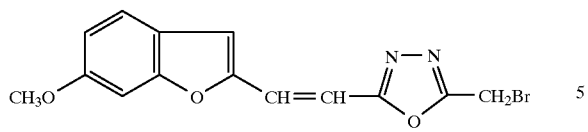
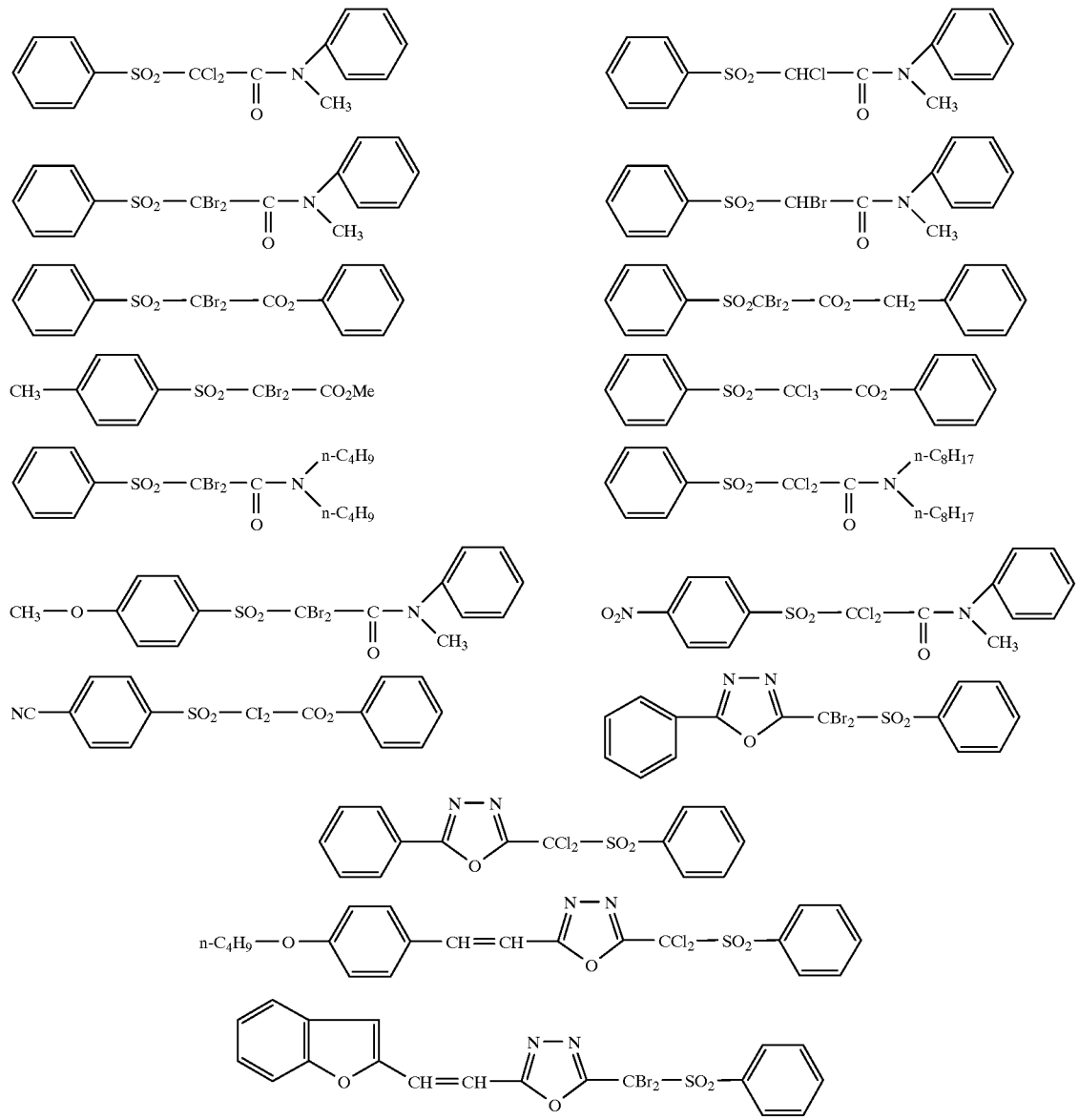
compounds described in German Patent No. 2,641,100, such as 4-(4-methoxystyryl)-6-(3,3,3-trichloropropenyl)-2-pyrone and 4-(3,4,5-trimethoxystyryl)-6-trichloromethyl-2-pyrone;
compounds described in German Patent No. 3,333,450, such as
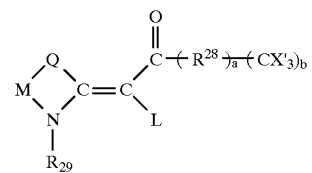
(Q = S; $R^{28}$ = a benzene ring)

| | R²⁹ | M | L | a | (CX'₃)ᵦ |
|---|---|---|---|---|---|
| 1 | C₂H₅ | 1,2-phenylene | H | 1 | 4-CCl₃ |
| 2 | CH₂C₆H₅ | 1,2-phenylene | H | 1 | 4-CCl₃ |
| 3 | C₂H₅ | 1,2-phenylene | H | 1 | 3-CCl₃ |
| 4 | C₂H₅ | 1,2-phenylene | H | 1 | 4-CF₃ |
| 5 | C₂H₅ | 5-CH₃-1,2-phenylene | H | 0 | CCl₃ |
| 6 | CH₂C₆H₅ | 1,2-phenylene | H | 0 | CCl₃ |
| 7 | C₂H₄OCH₃ | 1,2-phenylene | H | 1 | 4-CCl₃ | compounds described in German Patent No. 3,021,590:

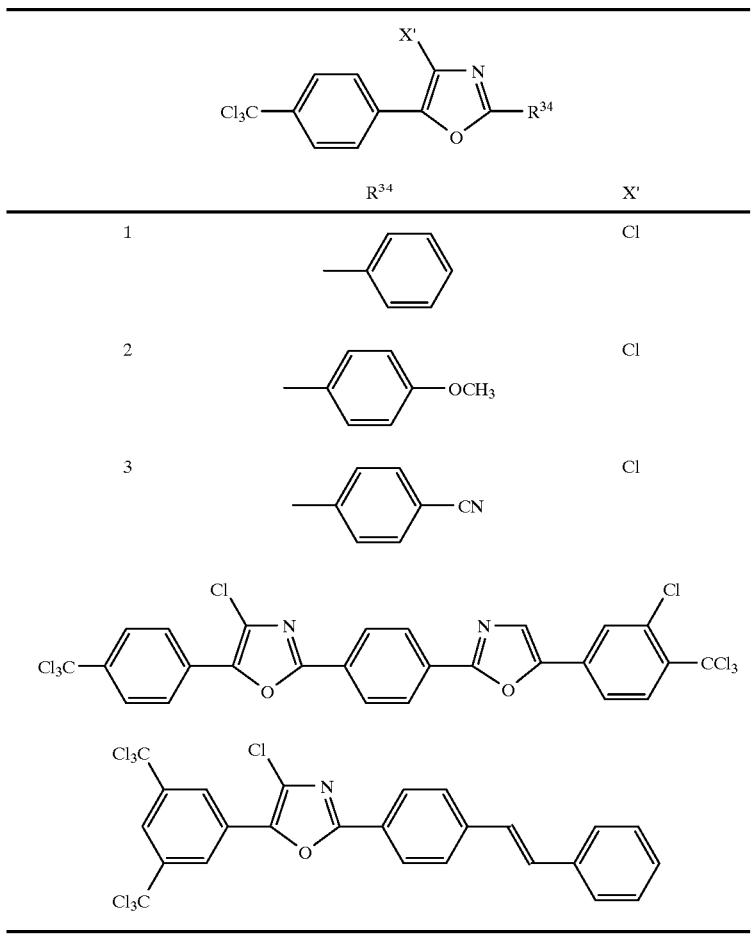

| | R³⁴ | X' |
|---|---|---|
| 1 | (phenyl) | Cl |
| 2 | (4-methoxyphenyl) | Cl |
| 3 | (4-cyanophenyl) | Cl |

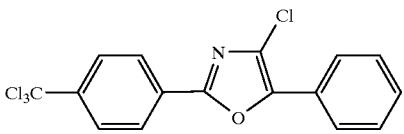

compounds described in German Patent No. 3,021,599:

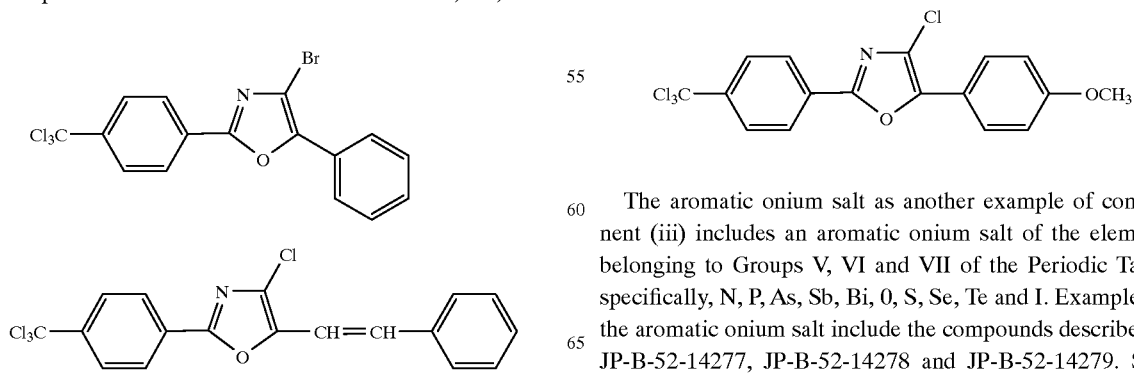

The aromatic onium salt as another example of component (iii) includes an aromatic onium salt of the elements belonging to Groups V, VI and VII of the Periodic Table, specifically, N, P, As, Sb, Bi, 0, S, Se, Te and I. Examples of the aromatic onium salt include the compounds described in JP-B-52-14277, JP-B-52-14278 and JP-B-52-14279. Specific examples thereof include the following compounds.

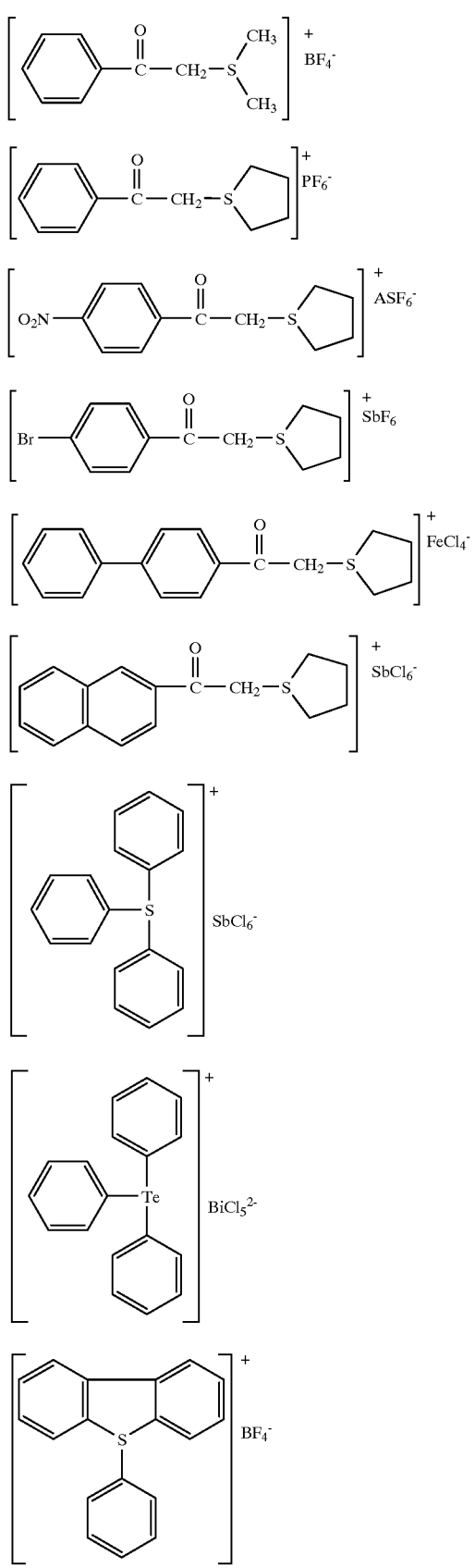
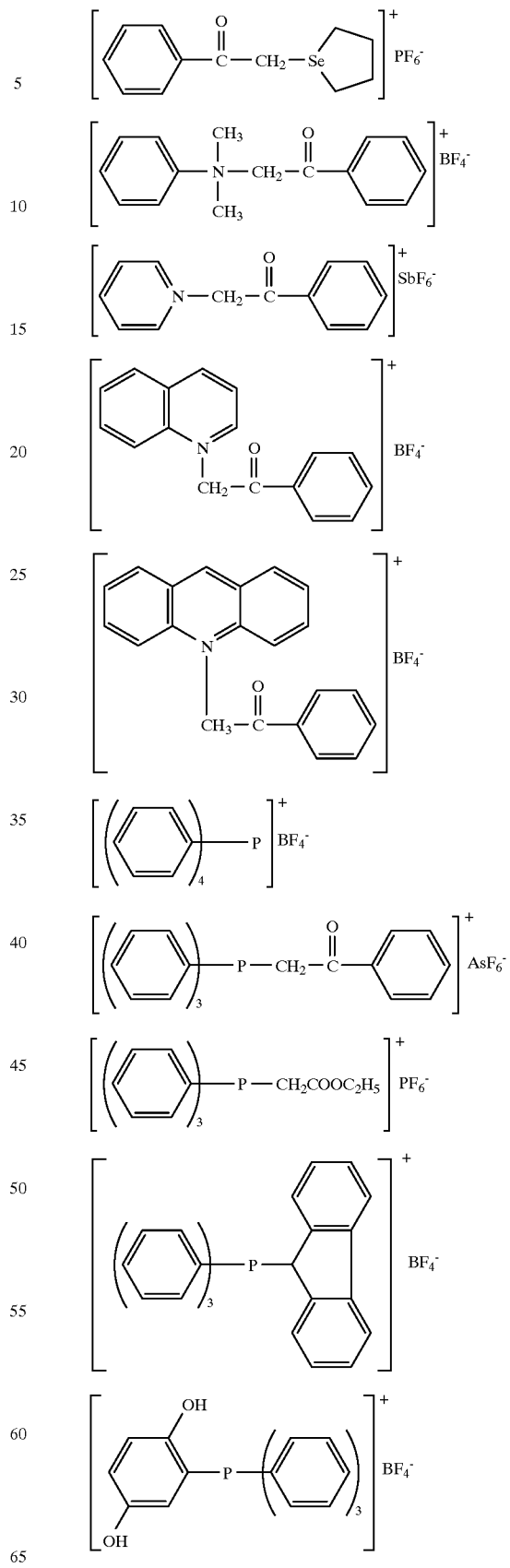

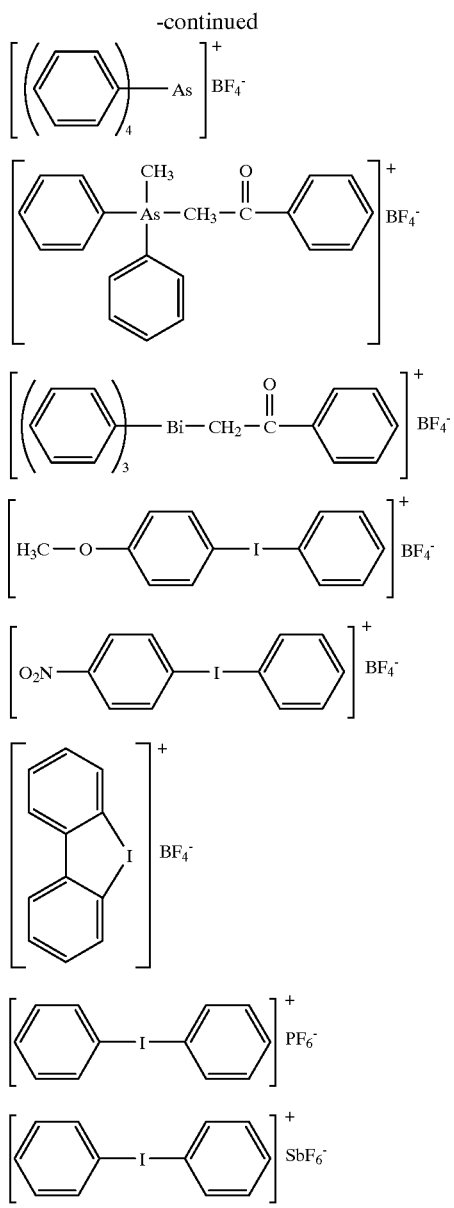

peroxydicarbonate, dimethoxyisopropyl peroxycarbonate, di (3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tertiary carbonate, 3,3',4,4'-tetra-(t-butylperoxycarbonyl) benzophenone, 3,3',4,4'-tetra-(t-aminoperoxycarbonyl) benzophenone, 3,3',4,4'-tetra-(t-hexylperoxycarbonyl) benzophenone, 3,3',4,4'-tetra(t-octyl-peroxycarbonyl) benzophenone, 3,3',4,4'-tetra(cumylperoxycarbonyl) benzophenone, 3,3',4,4'-tetra(p-isopropylcumylperoxycarbonyl)benzophenone, carbonyldi (t-butylperoxy dihydrogen diphthalate) and carbonyldi (t-hexylperoxy dihydrogen diphthalate).

Among these, preferred are peroxide esters such as 3,3', 4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone and di-t-butyl diperoxyisophthalate.

The thio compound as an example of component (iii) for use in the present invention is represented by the following formula (X):

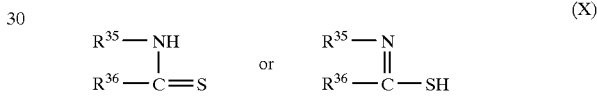

(X)

wherein $R^{35}$ represents an alkyl group, an aryl group or a substituted aryl group, $R^{36}$ represents a hydrogen atom or an alkyl group, and $R^{35}$ and $R^{36}$ may be combined with each other to represent a nonmetallic atom group necessary for forming a 5-, 6- or 7-membered ring which may contain a hetero atom selected from an oxygen atom, a sulfur atom and a nitrogen atom.

The alkyl group represented by $R^{35}$ in formula (X) is preferably an alkyl group having from 1 to 4 carbon atoms. The aryl group represented by $R^{35}$ is preferably an aryl group having from 6 to 10 carbon atom such as phenyl and naphthyl, and the substituted aryl group includes the above-described aryl group substituted by a halogen atom such as chlorine, an alkyl group such as methyl or an alkoxy group such as methoxy or ethoxy. $R^{36}$ is preferably an alkyl group having from 1 to 4 carbon atoms.

Specific examples of the thio compound represented by formula (X) include the following compounds.

The organic peroxide as still another example of component (iii) for use in the present invention includes almost all organic compounds having one or more oxygen-oxygen bonds in the molecule, and examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy) cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, ditert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-oxanoyl peroxide, succinic peroxide, benzoyl peroxide, 2,4-dichlorobenzoyl peroxide, metatoluoyl peroxide, diisopropyl peroxydicarbonate, di-2-ethylhexyl peroxydicarbonate, di-2-ethoxyethyl

| No. | $R^{35}$ | $R^{36}$ |
|---|---|---|
| 1 | H | H |
| 2 | H | $CH_3$ |
| 3 | $CH_3$ | H |
| 4 | $CH_3$ | $CH_3$ |
| 5 | $C_6H_5$ | $C_2H_5$ |
| 6 | $C_6H_5$ | $C_4H_9$ |
| 7 | $C_6H_4Cl$ | $CH_3$ |
| 8 | $C_6H_4Cl$ | $C_4H_9$ |
| 9 | $C_6H_4$—$CH_3$ | $C_4H_9$ |
| 10 | $C_6H_4$—$OCH_3$ | $CH_3$ |
| 11 | $C_6H_4$—$OCH_3$ | $C_2H_5$ |

-continued

| No. | R³⁵ | R³⁶ |
|---|---|---|
| 12 | C₆H₄OC₂H₅ | CH₃ |
| 13 | C₆H₄OC₂H₅ | C₂H₅ |
| 14 | C₆H₄OCH₃ | C₄H₉ |
| 15 | | $-\!\!\!+\!CH_2\!\!+\!\!_2\!-$ |
| 16 | | $-\!\!\!+\!CH_2\!\!+\!\!_2\!-S-$ |
| 17 | | —CH(CH₃)—CH₂—S— |
| 18 | | —CH₂CH(CH₃)—S— |
| 19 | | —C(CH₃)₂—CH₃—S— |
| 20 | | —CH₂—C(CH₃)₂—S— |
| 21 | | $-\!\!\!+\!CH_2\!\!+\!\!_2\!-O-$ |
| 22 | | —CH(CH₃)—CH₂—O— |
| 23 | | —C(CH₃)₂—CH₂—O— |
| 24 | | —CH=CH—N(CH₃)— |
| 25 | | $-\!\!\!+\!CH_2\!\!+\!\!_3\!-S-$ |
| 26 | | $-\!\!\!+\!CH_2\!\!+\!\!_2\!-CH(CH_3)\!+\!S-$ |
| 27 | | $-\!\!\!+\!CH_2\!\!+\!\!_3\!-O-$ |
| 28 | | $-\!\!\!+\!CH_2\!\!+\!\!_5\!-$ |
| 29 | | —C₆H₄—O— |
| 30 | | —N=C(SCH₃)—S— |
| 31 | | —C₆H₄—NH— |
| 32 | | 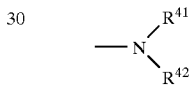 |

The hexaarylbiimidazole as another example of component (iii) for use in the present invention includes 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

The ketooxime ester as another example of component (iii) for use in the present invention includes 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

The borate salt as still another example of component (iii) for use in the present invention includes the compound represented by the following formula (XI):

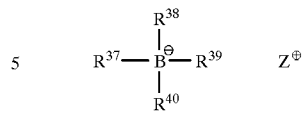

(XI)

wherein $R^{37}$, $R^3$, $R^{39}$ and $R^{40}$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, two or more groups of $R^{37}$, $R^{38}$, $R^{39}$ and $R^{40}$ may be combined to form a cyclic structure, provided that at least one of $R^{37}$, $R^{38}$, $R^{39}$ and $R^{40}$ is a substituted or unsubstituted alkyl group, and $Z^+$ represents an alkali metal cation or a quaternary ammonium cation.

The alkyl group represented by $R^{37}$, $R^{38}$, $R^{39}$ or $R^{40}$ includes linear, branched and cyclic alkyl groups each preferably having from 1 to 18 carbon atoms. Specific examples thereof include methyl, ethyl, propyl, isopropyl, butyl, pentyl, hexyl, octyl, stearyl, cyclobutyl, cyclopentyl and cyclohexyl. The substituted alkyl group includes the above-described alkyl group having a substituent such as a halogen atom (e.g., —Cl, Br), a cyano group, a nitro group, an aryl group (preferably a phenyl group), a hydroxy group, $$-\text{N}\begin{subarray}{l}R^{41}\\R^{42}\end{subarray}$$

(wherein $R^{41}$ and $R^{42}$ each independently represents a hydrogen atom, an alkyl group having from 1 to 14 carbon atoms or an aryl group), —COOR⁴³ (wherein $R^{43}$ represents a hydrogen atom, an alkyl group having from 1 to 14 carbon atoms or an aryl group), —OCOR⁴⁴ or —OR⁴⁴ (wherein $R^{44}$ represents an alkyl group having from 1 to 14 carbon atoms or an aryl group).

The aryl group represented by $R^3$, $R^{38}$, $R^{39}$ or $R^{40}$ includes a mono-, di- or tri-cyclic aryl group such as phenyl and naphthyl, and the substituted aryl group includes the above-described aryl group having a substituent described above for the substituted alkyl group or an alkyl group having from 1 to 14 carbon atoms.

The alkenyl group represented by $R^{37}$, $R^{38}$, $R^{39}$ or $R^{40}$ includes linear, branched and cyclic alkenyl groups each having from 2 to 18 carbon atoms, and the substituent for the substituted alkenyl group includes the substituents described above for the substituted alkyl group.

The alkynyl group represented by $R^{37}$, $R^{38}$, $R^{39}$ or $R^{40}$ includes linear and branched alkynyl groups each having from 2 to 28 carbon atoms, and the substituent of the substituted alkynyl group includes the substituents described above for the substituted alkyl group.

The heterocyclic group represented by $R^3$, $R^{38}$, $R^{39}$ or $R^{40}$ includes 5- and greater membered, preferably 5- to 7-membered, heterocyclic groups each containing at least one of N, S and O, and the heterocyclic group may contain a condensed ring and further may have a substituent described above for the substituted alkyl group.

Specific examples of the compound represented by formula (XI) include the compounds described in U.S. Pat.

Nos. 3,567,453 and 4,434,891 and European Patent Nos. 109,772 and 109,773 and the compounds described below.

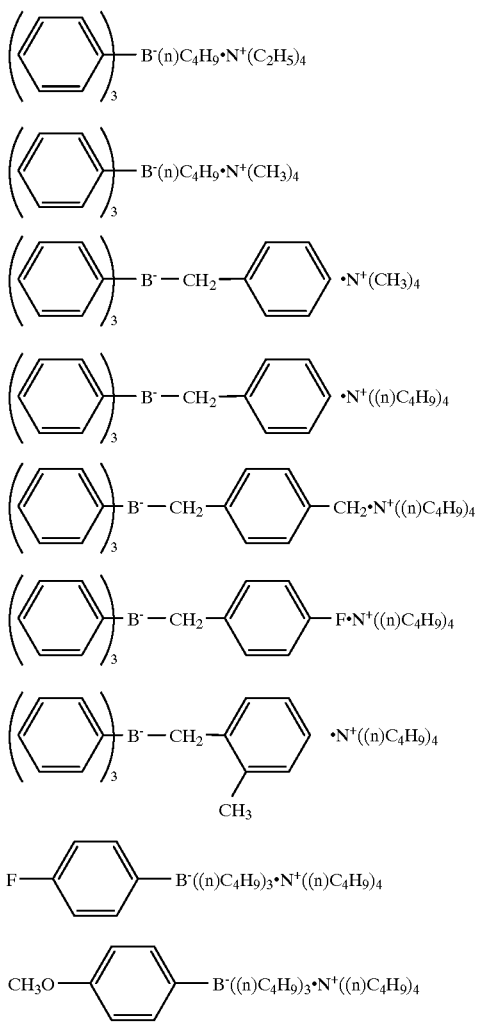

Examples of the azinium salt compound as another example of component (iii) for use in the present invention include the compounds having an N—O bond described in U.S. Pat. No. 4,743,528, JP-A-63-138345, JP-A-63-142345, JP-A-63-142346, JP-A-63-143537 and JP-B-46-42363. Examples of the azinium salt compound include 1-methoxy-4-phenylpyridinium tetrafluoroborate.

Examples of the metallocene compound as still another example of component (iii) include various titanocene compounds described in JP-A-59-152396, JP-A-61-151197, JP-A-63-41484, JP-A-2-249, JP-A-2-4705 and JP-A-5-83588, such as dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl and dimethylcyclopentadienyl-Ti-bis-2,3,4,5,6-pentafluorophen-1-yl. Also, the iron-allene complexes described in JP-A-1-304453 and JP-A-1-152109 may be suitably used.

Examples of the active ester compound as still another example of component (iii) include the imidosulfonate compounds described in JP-B-62-6223 and the active sulfonates described in JP-B-63-14340 and JP-A-59-174831.

The compounds as component (iii) for use in the present invention may be used individually or in combination of two or more thereof.

The concentration of the photopolymerization initiation system, namely, component (ii) and component (iii), contained in the composition of the present invention is usually low and if it is unduly excessive, disadvantageous results such as cutoff of effective light rays may be caused.

In the pre sent invention, the amount of the photopolymerization initiation system is from 0.01 to 60% by weight, preferably from 1 to 30% by weight, based on the total amount of the photopolymerizable, ethylenically unsaturated compound and the linear organic high molecular polymer which is added if desired.

With respect to the ratio between component (i) an d component (iii) as the components in the photopolymerization initiation system used in the present invention, component (iii) is preferably used in an amount of from 0.01 to 50 parts by weight, more preferably from 0.02 to 20 parts by weight and most preferably from 0.05 to 10 parts by weight, per 1 part by weight of the organic dye as component (i).

The photopolymerizable composition of the present invention may further contain a known compound which acts to increase more the sensitivity or prevent the polymerization inhibition due to oxygen, as a co-sensitizer.

An example of the co-sensitizer is amines and examples thereof include the compounds described in M. R. Sander et al., Journal of Polymer Society, Vol. 10, p. 3173 (1972), JP-B-44-20189, JP-A-51-82102, JP-A-52-134692, JP-A-59-138205, JP-A-60-84305, JP-A-62-18537, JP-A-64-33104 and Research Disclosure, No. 33825. Examples thereof include triethanolamine, ethyl p-dimethylaminobenzoate, p-formyldimethylaniline and p-methylthiodimethylaniline.

Other examples of the co-sensitizer are thiols and sulfides and examples thereof include the thiol compounds described in JP-A-53-705, JP-B-55-500806 and JP-A-5-142772 and the disulfide compounds described in JP-A-56-75643. Examples thereof include 2-mercaptobenzothiazole, 2-mercaptobenzoxazole, 2-mercaptobenzimidazole, 2-mercapto-4(3H)-quinazoline and β-mercaptonaphthalene.

Still other examples of the co-sensitizer are amino acid compounds (e.g., N-phenylglycine), organometallic compounds described in JP-B-48-42965 (e.g., tributyltin acetate), hydrogen donors described in JP-B-55-34414, sulfur compounds described in Japanese Patent Application No. 5-91089 (e.g. trithiane), phosphorus compounds described in JP-A-6-250389 (e.g., diethyl phosphite) and Si-H and Ge-H compounds described in Japanese Patent Application No. 6-191605.

Still another example of the co-sensitizer is aminoketone compounds described in U.S. Pat. No. 4,318,791 and European Patent Application No. 0284561A1 and examples thereof include the following compounds.

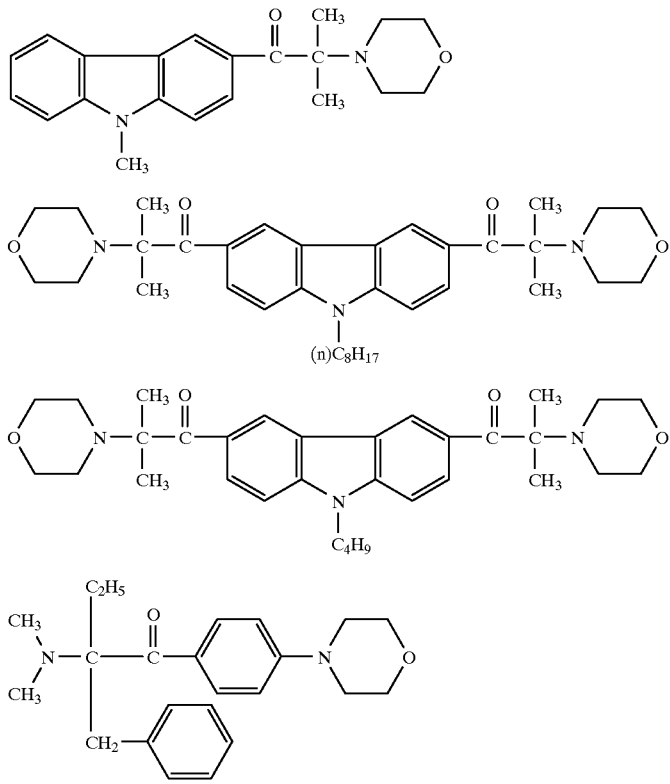
Another suitable example of the co-sensitizer is oxime ethers described in Japanese Patent Application No. 7-13108 and examples thereof include the following compounds.
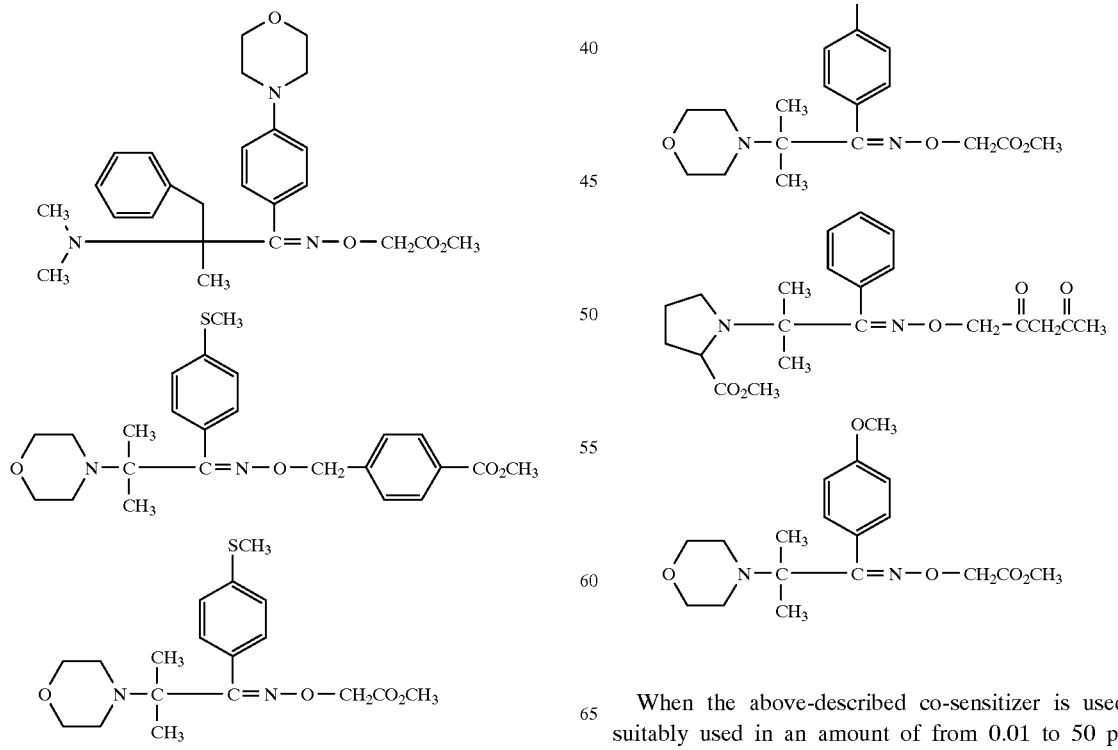
When the above-described co-sensitizer is used, it is suitably used in an amount of from 0.01 to 50 parts by weight, preferably from 0.02 to 20 parts by weight and most preferably from 0.05 to 10 parts by weight, per 1 part by weight of the compound as component (i).

The photopolymerizable composition of the present invention preferably contains a linear organic high molecular polymer as a binder. The "linear organic high molecular polymer" may be any linear organic high molecular polymer as long as it has compatibility with the photopolymerizable, ethylenically unsaturated compound. Preferably, a water- or alkalescent water-soluble or swellable linear organic high molecular polymer capable of water development or alkalescent water development is selected. The linear organic high molecular polymer is used not only as a film forming agent of the composition but also as a developer, and the polymer is appropriately selected depending on the use of water, alkalescent water or an organic solvent. For example, when a water-soluble organic high molecular polymer is used, water development can be carried out. This kind of linear organic high molecular polymer includes an addition polymer having a carboxylic acid group on the side chain and examples thereof include a methacrylic acid copolymer, an acrylic acid copolymer, an itaconic acid copolymer, a crotonic acid copolymer, a maleic acid copolymer and a partially esterified maleic acid copolymer described in JP-A-59-44615, JP-B-54-34327, JP-B-58-12577, JP-B-54-25957, JP-A-54-92723, JP-A-59-53836 and JP-A-59-71048. Further, an acidic cellulose derivative having a carboxylic acid group on the side chain may be used. An addition product of a cyclic acid anhydride to the addition polymer having a hydroxyl group is also useful. Among these, a [benzyl (meth)acrylate/(meth)acrylic acid/other addition polymerizable vinyl monomer, if desired] copolymer and an [allyl (meth)acrylate/(meth)acrylic acid/other addition polymerizable vinyl monomer, if desired] copolymer are preferred. In addition, polyvinyl pyrrolidone and polyethylene oxide are useful as a water-soluble linear organic polymer. Further, an alcohol-soluble polyamide and a polyether of 2,2-bis(4-hydroxyphenyl)propane with epichlorohydrin are also useful so as to increase the strength of the cured film. It is preferred that the linear organic high molecular polymer has a weight average molecular weight (Mw) of 2,000 or more, more preferably from 4,000 to 300,000, and a number average molecular weight (Mn) of 1,000 or more, more preferably from 2,000 to 250,000, and a dispersibility (the ratio of Mw/Mn) of 1 or more, more preferably 1.1 to 10. The above-described linear organic high molecular polymer can be mixed into the entire composition in an arbitrary amount. However, if the added amount exceeds 90% by weight, disadvantageous results may be caused in view of the strength of an image formed and the like. Preferred amount thereof is from 30 to 85% by weight. The weight ratio of the photopolymerizable, ethylenically unsaturated compound to the linear organic high molecular polymer is preferably from ⅛ to ⅞, more preferably from ⅜ to ⅝.

In the present invention, other than the above-described fundamental components, a slight amount of a thermal polymerization inhibitor is preferably added so as to prevent unnecessary thermal polymerization of the polymerizable, ethylenically unsaturated compound during the production or storage of the photosensitive composition. Examples of suitable thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine primary cerium salt and N-nitrosophenylhydroxylamine aluminum salt. The addition amount of the thermal polymerization inhibitor is preferably from about 0.01 to about 5% based on the weight of the whole composition. Also, if desired, a higher fatty acid derivative such as a behenic acid and a behenic acid amide may be added to disperse unevenly on the surface of the photosensitive layer during the drying process after coating so as to prevent the polymerization inhibition due to oxygen. The addition amount of the higher fatty acid derivative is preferably from about 0.5 to about 10% of the whole composition.

In the present invention, a dye or a pigment may be added for the purpose of coloring the photosensitive layer. The addition amount of the dye or the pigment is from 0.01 to 20%, preferably from 0.5 to 10% of the whole composition. A pigment is preferred to a dye.

As the pigment, commercially available pigments and known pigments described in various publications, for example, in *Color Index (C.I.) Binran, "Saishin Ganryo Binran"*, Nippon Ganryo Gijutsu Kyokai (compiler) (1977), *Saishin Ganryo Oyo Gijutsu*, CMC Shuppan (1986) and *Insatsu Ink Giiutsu*, CMC Shuppan (1984), can be used.

Examples of the pigment include a black pigment, a yellow pigment, an orange pigment, a brown pigment, a red pigment, a violet pigment, a blue pigment, a green pigment, a fluorescent pigment, a metal powder pigment and in addition, a polymer bonded dye. Examples thereof include an insoluble azo pigment, an azo lake pigment, a condensed azo pigment, a chelate azo pigment, a phthalocyanine-base pigment, an anthraquinone-base pigment, a perylene- or perynone-base pigment, a thioindigo-base pigment, a quinacridone-base pigment, a dioxazine-base pigment, an isoindolinone-base pigment, a quinophthalone-base pigment, a dyed lake pigment, an azine pigment, a nitroso pigment, a nitro pigment, a natural pigment, a fluorescent pigment and an inorganic pigment. Among these, preferred are an insoluble azo pigment, an azo lake pigment, a phthalocyanine-base pigment and an anthraquinone-base pigment.

The pigment may be dispersed in the presence of a polymer and examples of the polymer include polymers having an aliphatic double bond on the main chain or on the side chain as represented by formulae (x), (y) and (z) of Japanese Patent Application No. 6-193357:

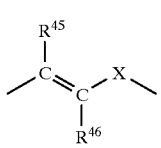

(x)

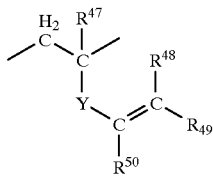
(y)

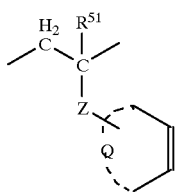
(z)

wherein $R^{45}$, $R^{46}$, $R^{47}$, $R^{48}$, $R^{49}$, $R^{50}$ and $R^{51}$ each independently represents a hydrogen atom, an alkyl group or an aryl group, X, Y and Z each independently represents a divalent linking group, and Q represents an atomic group necessary for forming an aliphatic ring.

The alkyl group includes an alkyl group preferably having 20 or less, more preferably 10 or less, still more preferably 6 or less, carbon atoms (e.g., methyl, ethyl, propyl, butyl, hexyl, isopropyl).

The aryl group includes an aryl group having from 6 to 22 carbon atoms (e.g., phenyl, naphthyl, anthryl).

The alkyl group or the aryl group may be substituted by a substituent such as an alkoxy group, an amido group or an alkoxycarbonyl group.

$R^{45}$, $R^{46}$, $R^{47}$, $R^{48}$, $R^{49}$, $R^{50}$ and $R^{51}$ each is preferably a hydrogen atom or an alkyl group, more preferably a hydrogen atom or methyl.

Examples of the divalent linking group represented by X or Y include an alkylene group, an arylene group, a carbonyl group, an imino group, an oxygen atom, a sulfur atom or a combination of these. The divalent linking group may be substituted by an aryl group, a halogen atom, a hydroxyl group or a cyano group.

The alkylene group includes an alkylene group having preferably 10 or less, more preferably 6 or less, still more preferably 3 or less, carbon atoms (e.g., —CH$_2$CH$_2$CH$_2$—, —CH$_2$CH$_2$—, —CH$_2$CH(CH$_3$)—).

The arylene group includes an arylene group having from 6 to 22 carbon atoms (e.g.,

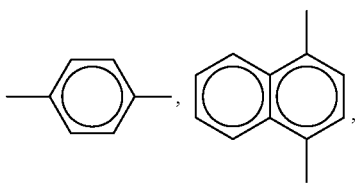

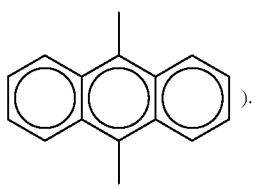
).

X is preferably an alkylene group.

Y is preferably an alkylene group, a carbonyl group, an oxygen atom or a combination thereof.

The aliphatic ring formed by Q is preferably an aliphatic ring having from 5 to 30 carbon atoms resulting from combination of 5- or 6-membered rings (e.g., cyclohexane ring, norbornenyl ring, dicyclopentadiene ring). The aliphatic ring includes bicyclic or tricyclic hydrocarbon having a bridgehead carbon atom. The number of the carbon-carbon double bond present in the aliphatic ring is preferably one.

The photopolymerizable composition of the present invention may contain an inorganic filler or other known additives for improving physical properties of the cured film.

Further, a surface active agent is preferably added so as to improve the surface state on coating. The surface active agent is preferably a fluorine-base surface active agent.

The photopolymerizable composition of the present invention is dissolved in an organic solvent and then coated on a support. Various solvents can be used and examples thereof include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, y-butyrolactone, methyl lactate and ethyl lactate. These solvents may be used individually or in combination. The solid concentration in the coating solution is suitably from 2 to 50 wt %. The coverage is in terms of the weight after drying preferably from about 0.1 to about 10 g/m$^2$, more preferably from 0.5 to 5 g/m$^2$.

As the above-described support, a dimensionally stable, plate-like material is used. Examples of the dimensionally stable, plate-like material include paper, paper laminated with plastics (e.g., polyethylene, polypropylene, polystyrene), sheet of a metal such as aluminum (including aluminum alloy), zinc or copper, a plastic film such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal, and paper or plastic film laminated with or having evaporated thereon the above-described metal. Among these supports, an aluminum plate is particularly preferred because it is dimensionally stable to an extreme extent and in addition, cheap. Also, a composite sheet obtained by bonding an aluminum sheet on a polyethylene terephthalate film described in JP-B-48-18327 may be preferably used.

A support having a metal surface, particularly an aluminum surface, is preferably subjected to surface treatment such as graining treatment, dipping treatment in an aqueous solution of sodium silicate, potassium fluorozirconate or phosphate, or anodic oxidation treatment.

The graining treatment is preferably brush graining or electrolysis graining. In the case of electrolysis graining, the electrolytic solution is preferably an aqueous solution of nitric acid or hydrochloric acid, more preferably an aqueous solution of nitric acid.

An aluminum plate subjected to graining and then to dipping treatment in an aqueous solution of sodium silicate may be preferably used. Further, an aluminum plate subjected to anodic oxidation treatment and then to dipping treatment in an aqueous solution of alkali metal silicate described in JP-B-47-5125 may be also suitably used.

The anodic oxidation treatment is carried out by applying current to the aluminum plate as an anode in an electrolytic solution, for example, in an aqueous or non-aqueous solution of an inorganic acid such as phosphoric acid, chromic acid, sulfuric acid or boric acid, of an organic acid such as oxalic acid or sulfamic acid, or of a salt thereof, which solutions may be used individually or in combination of two or more thereof.

The silicate electrodeposition described in U.S. Pat. No. 3,658,662 is also effective.

Further, the surface treatment comprising a combination of electrolysis graining with the above-described anodic oxidation treatment and sodium silicate treatment disclosed in JP-B-46-27481, JP-A-52-58602 and JP-A-52-30503 is also useful. In this case, the sodium silicate treatment may be omitted.

Furthermore, a support may also be suitably subjected to mechanical graining, chemical etching, electrolysis graining, anodic oxidation treatment and sodium silicate treatment successively as disclosed in JP-A-56-28893.

Still further, a support may be suitably subjected, after the above-described treatments, to undercoating with a water-soluble resin such as a polymer or copolymer having a polyvinyl phosphonic acid or sulfonic acid group on the side chain, a polyacrylic acid or a water-soluble metal salt (e.g., zinc borate), or with a yellow dye or an amine salt.

The above-described treatment to achieve hydrophilicity is effected not only to render the support surface hydrophilic but also to prevent harmful reaction of the photopolymerizable composition to be coated thereon and to improve the adhesion property of the photosensitive layer.

Further, the back surface of the support may be preferably subjected to backcoating described in JP-A-5-2271 and JP-A-6-35174 so as to prevent the elution of aluminum into the developer.

In order to prevent polymerization inhibition action of the oxygen in air, a protective layer comprising a polymer having an excellent oxygen cutting property, such as polyvinyl alcohol, in particular, polyvinyl alcohol having a saponification degree of 95% or more, or an acidic cellulose, may be provided on the photopolymerizable composition layer on the support. The coating method of the protective layer is described in detail, for example, in U.S. Pat. No. 3,458,311 and JP-A-55-49729. The coating amount thereof is preferably from 0.1 to 5.0 g, more preferably from 0.5 to 3 g.

The photopolymerizable composition of the present invention can be used in usual photopolymerization. Further, the composition can be used in various fields, for example, as a photoresist in producing a printing plate or a printed board. In particular, since the photopolymerizable composition of the present invention has such properties as high sensitivity and wide spectral sensitivity extending even to a visible light region, the composition can provide good effects When it is applied to a photosensitive material for a visible light laser such as an $Ar^+$ laser or a YAG-SHG laser.

Further, the photopolymerizable composition of the present invention is highly sensitive and has sensitivity to visible light and therefore, it can be advantageously used particularly for an image formation system using a microcapsule.

The application to the image formation system using a microcapsule is described, for example, in JP-A-57-197538, JP-A-61-130945, JP-A-58-88739, JP-A-58-88740 and European Patent Application No. 223,587A1. This image formation method comprises coating on a support a microcapsule containing, for example, a photopolymerization initiator composition, which comprises an ethylenic vinyl compound and a photopolymerization initiator, and a dye precursor, imagewise exposing the resulting photosensitive sheet to cure microcapsules on the exposed area, superposing a developer sheet thereon and applying pressure throughout the sheet to rapture the microcapsules on the unexposed area, whereby a dye image-forming material (e.g., a dye precursor) is transferred to an image-receiving element (e.g., developer layer) to form colors.

The photosensitive material using the photopolymerizable composition of the present invention may be heated after the imagewise exposure. The heating temperature is preferably from 60 to 160° C., more preferably from 80 to 130° C. The heating time is preferably from 1 second to 5 minutes.

The unexposed area of the photosensitive layer is removed by a developer to obtain an image. In using the photopolymerizable composition for producing a lithographic printing plate, the developer described in JP-B-57-7427 is preferred and an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia or of an organic alkali agent such as monoethanolamine or diethanolamine is suitably used. The alkali agent is added to give a concentration of from 0.1 to 10 wt %, preferably from 0.5 to 5 wt %.

The above-described alkaline aqueous solution may contain, if desired, a surface active agent or an organic solvent such as benzyl alcohol, 2-phenoxyethanol or 2-butoxyethanol, in a small amount. Examples thereof include those described in U.S. Pat. Nos. 3,375,171 and 3,615,480. Further, the developers described in JP-A-50-26601, JP-A-58-54341, JP-B-56-39464 and JP-B-56-42860 are also excellent.

However, the use of an organic solvent involves a hygienic problem such as toxicity and odor at the operation site, a safety problem such as firing, a problem in view of operationability such as generation of bubbles, or a problem of environmental pollution due to the waste water, and accordingly, the developer preferably contains substantially no organic solvent. The aqueous alkali developer substantially free of an organic solvent includes the developer compositions described, for example, in JP-A-59-84241 and JP-A-57-192952.

A commercially available developer which can be suitably used is a solution obtained by diluting DP-4 (produced by Fuji Photo Film Co., Ltd.) with water to from ⅙ to ¹⁄₃₀.

The photosensitive lithographic printing plate using the photopolymerizable composition of the present invention may be subjected to such treatments as described in JP-A-54-8002, JP-A-55-115045 and JP-A-59-58431, more specifically, after development, desensitizing treatment through or without water washing, treatment with an aqueous solution containing an acid or desensitizing treatment after the treatment with an aqueous solution containing an acid. In the development process of this kind of photosensitive lithographic printing plate, the aqueous alkali solution is consumed according to the processed amount to cause reduction in the alkali concentration or the alkali concentration is reduced due to air in a long-time operation in an automatic developing machine to lower the processing capability. In this case, the processing capability can be recovered by the replenishers and the replenishing methods described in JP-A-54-62004, JP-A-55-22759., JP-A-55-115039, JP-A-56-12645, JP-A-58-95349, JP-A-64-21451, JP-A-1-180548 and JP-A-2-3065.

The above-described print-making process is preferably carried out in an automatic developing machine described in JP-A-2-7054 and JP-A-2-32357. As the desensitizing gum to be coated, if desired, at the final step of the print-making process, those described in JP-B-62-16834, JP-B-62-25118, JP-B-63-52600, JP-A-62-7595, JP-A-62-11693 and JP-A-62-83194 are preferably used.

After the development, the printing plate may be subjected to burning heat treatment or post exposure to improve the printing durability at printing.

The photopolymerizable composition of the present invention exhibits high sensitivity to actinic light rays over a wide region of from ultraviolet light to visible light. Accordingly, an ultrahigh-pressure mercury lamp, a high-pressure mercury lamp, a medium-pressure mercury lamp, a low-pressure mercury lamp, a chemical lamp, a carbon arc lamp, a xenon lamp, a metal halide lamp, various laser lamps such as a visible laser lamp and an ultraviolet laser lamp, a fluorescent lamp, a tungsten lamp or sunlight can be used as a light source.

The present invention will be described in greater detail below by referring to the examples, but the present invention should not be construed as being limited to these examples.

SYNTHESIS EXAMPLE 1

Synthesis of Compound No. 12 represented by formula (I) of the present invention:

When trimethylsilylmethyl trifluoromethanesulfonate (10.4 g, produced by Tokyo Kaseihin KK) was added to 2-methylthio-1,3-benzothiazole (7.2 g, produced by Tokyo Kaseihin KK), heat was generated immediately and the mixture was turned into white powder. After 1 hour, the powder was dissolved in methylene chloride (100 ml), ethyl rhodanine (5.9 g, produced by Tokyo Kaseihin KK) was charged thereinto, and further triethylamine (8.1 g) was added. The mixture was stirred at room temperature for 1 hour and then, orange crystals were precipitated. The crystals were filtered and washed with ethyl acetate to obtain Compound No. 12. Yield: 11.4 g (74.9%).

SYNTHETIC EXAMPLE 2

Synthesis of Compound No. 14 represented by formula (I):

Compound No. 12 (3.8 g) obtained above and ethyl trifluoromethanesulfonate (6.0 g, produced by Tokyo Kaseihin KK) were stirred at 120° C. After 1 hour, the mixture was turned to a red solution. Thereto, ethyl acetate/hexane (100 ml/70 ml) was added and when the solution was cooled to room temperature, yellow crystals came out. The crystals were filtered and air dried. The yellow crystals (5.6 g) obtained were charged into tetrahydrofuran (100 ml) (suspension form), and 60% sodium hydride (0.4 g) was added thereto at 0° C. To this suspension, a tetrahydrofuran (100 ml) solution of indanone (1.3 g) was gradually added dropwise (while keeping the temperature at 15° C. or lower). After 2 hours, the mixed solution was turned to a red solution. The resulting reaction solution was added to ice water (700 ml) to obtain Compound No. 14 as orange crystals precipitated. The crystals were filtered and recrystallized by methanol. Yield: 2.4 g (50%).

The final objective Compound Nos. 12 and 14 prepared above in Synthesis Examples 1 and 2 were verified on the structure by $^1$HNMR and MASS spectrum.

EXAMPLES 1 TO 16 AND COMPARATIVE EXAMPLES 1 TO 16

A 0.3 mm-thick aluminum plate was dipped in a 10% sodium hydroxide at 60° C. for 25 seconds to effect etching, washed with flowing water, neutralization-washed with a 20% nitric acid and then washed with water. The resulting plate was subjected to electrolysis graining treatment using a sinewaveform alternating current in a 1% aqueous nitric acid solution at an anode electricity quantity of 300 coulomb/dm$^2$. Subsequently, the plate was dipped in an aqueous solution of a 1% sodium hydroxide at 40° C. for 5 seconds and then dipped in an aqueous solution of a 30% sulfuric acid to effect desmutting at 60° C. for 40 seconds. Thereafter, the plate was subjected to anodic oxidation treatment in an aqueous solution of a 20% sulfuric acid at a current density of 2 A/dm$^2$ for 2 minutes to give an anodic oxide film thickness of 2.7 g/m$^2$. The surface roughness measured was 0.3 μm (Ra indication).

The following sol-gel reaction solution was coated on the back surface (untreated surface) of the thus-treated substrate by a bar coater and dried at 80° C. for 1 minute to prepare Support A having a backcoat layer in a coated amount after drying of 70 mg/m$^2$.

| Preparation of Sol-Gel Reaction Solution: | |
|---|---|
| Tetraethyl silicate | 50 parts by weight |
| Water | 20 parts by weight |
| Methanol | 15 parts by weight |
| Phosphoric acid | 0.05 part by weight |

The above-described components were mixed and stirred, and after about 5 minutes, heat generation started. After allowing them to react for 60 minutes, the following solution was added thereto to prepare a backcoat coating solution layer.

| | |
|---|---|
| Pyrogallol formaldehyde condensation resin (M.W. 2,000) | 4 parts by weight |
| Dimethyl phthalate | 5 parts by weight |
| Fluorine-base surface active agent (N-butyl perfluoro-octanesulfonamidoethyl-acrylate/polyoxyethylene acrylate copolymer, molecular weight: 20,000) | 0.7 part by weight |
| Methanol silica sol (produced by Nissan Chemical Industries, Ltd., methanol: 30%) | 50 parts by weight |
| Methanol | 800 parts by weight |

The photosensitive composition having the following composition was coated on the surface of the aluminum plate having an anodic oxide film provided above to give a dry coated weight of 1.5 g/m² and dried at 80° C. for 2 minutes to form a photosensitive layer.

| | |
|---|---|
| Pentaerythritol triacrylate | 2.0 g |
| Allyl methacrylate/methacrylic acid copolymer (copolymerization molar ratio: 80/20) | 2.0 g |
| Component (i) | X g |
| Component (iii) | Y g |
| Co-sensitizer (S) | Z g |
| Fluorine-base nonionic surface active agent (F-177, produced by Dainippon Ink & Chemicals, Inc.) | 0.03 g |
| Thermal polymerization inhibitor: N-nitrosophenylhydroxylamine aluminum salt | 0.01 g |
| Pigment Dispersion | 2.0 g |
| Composition P.B. 15:6 (copper phthalocyanine) | 30 parts |
| Allyl methacrylate/methacrylic acid copolymer (copolymerization molar ratio: 83/17) | 20 parts |
| Cyclohexanone | 35 parts |
| Methoxypropyl acetate | 35 parts |
| Propylene glycol monomethyl ether | 80 parts |
| Methyl ethyl ketone | 20 g |
| Propylene glycol monomethyl ether | 20 g |

The compounds shown below were used as component (i) component (iii) or co-sensitizer (S).

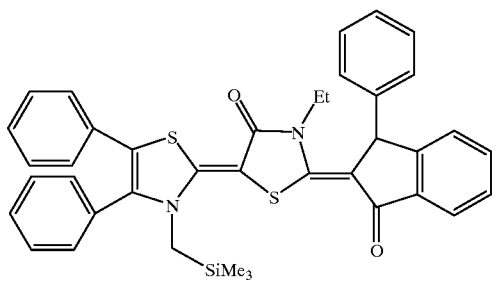

No. 8

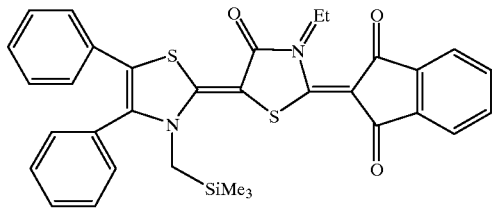

No. 34

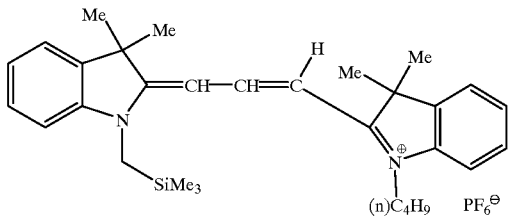

No. 51

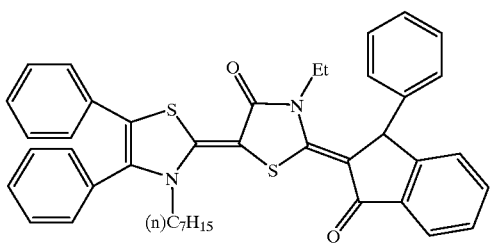

A-1

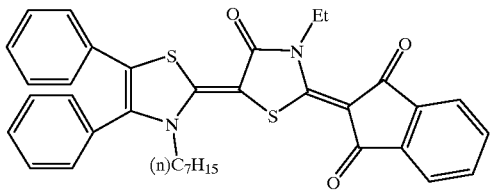

A-2

-continued

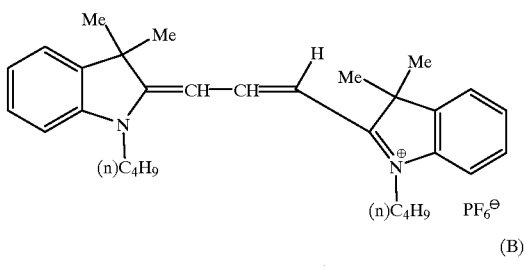

(B)

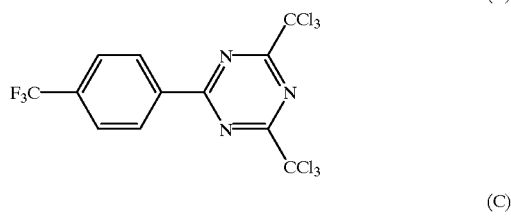

(C)

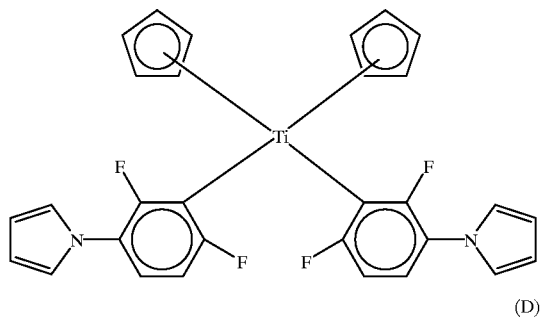

(D)

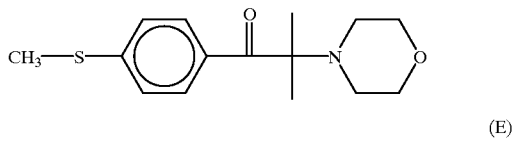

(E)

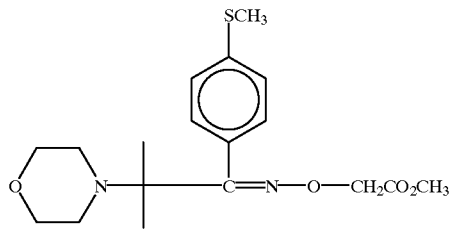

On the thus-provided photosensitive layer, a 3 wt % aqueous solution of polyvinyl alcohol (saponification degree: 98 mol %, polymerization degree: 1,000) was coated to give a dry coated weight of 2 g/m$^2$ and dried at 100° C. for 2 minutes to form a protective layer.

FUJI PS Step Guide (a gray scale discontinuously changed in the transmission density by $\Delta D=0.15$, manufactured by Fuji Photo Film Co., Ltd.) was put into close contact with each of the photosensitive materials obtained above and light for exposure was irradiated thereon.

The light source used was a xenon lamp and light was irradiated through Kenko Optical Filter BP-53. The energy on the PS Step Guide surface was 0.25 mJ/cm$^2$.

The exposed photosensitive materials each was heated at 120° C. for 20 seconds and then developed. The sensitivity was shown by a clear stage number of the PS Step Guide after development. The larger the stage number, the higher the sensitivity. The development was conducted by dipping each photosensitive material in the following developer at 25° C. for 10 seconds.

| | |
|---|---:|
| DP-4 (produced by Fuji Photo Film Co., Ltd.) | 65.0 g |
| Water | 880.0 g |
| Lipomin LA (20% aq. soln.) | 50.0 g |

For examining the aging stability of the photosensitive materials against heat and humidity, the photosensitive materials before exposure each was forcedly aged (by allowing it to stand at 60° C. and 75 RH for 3 days) and then subjected to the same exposure-heating and development as above. The clear stage number at this time was determined and the difference ($\Delta$clear stage number) from the clear stage number before the forced aging was used as an index for the change by aging. As the value of $\Delta$clear stage number is smaller, the material is more stable free from change in the sensitivity. In practical use, when $\Delta$clear stage number is within 0.5 stage, it can be judged that the material has no problem in stability in the production.

The results obtained are shown in Table A.

TABLE A

| | Copolymerization Initiator | | | | | | Sensitivity to Light through BP-53 Filter | Difference in Sensitivity by Forced Aging |
|---|---|---|---|---|---|---|---|---|
| | Component (ii) | X g | Component (iii) | Y g | Co-sensitizer (S) | Z g | (stage number of step wedge) | ($\Delta$stage number of step wedge) |
| Example 1 | No. 8 | 0.10 | (B) | 0.10 | | | 6.5 | 0.2 |
| Example 2 | No. 8 | 0.10 | (B) | 0.10 | (D) | 0.20 | 8.5 | 0.3 |
| Example 3 | No. 8 | 0.10 | (B) | 0.10 | (E) | 0.20 | 9.0 | 0 |
| Example 4 | No. 34 | 0.10 | (B) | 0.10 | (E) | 0.20 | 6.0 | 0.3 |
| Example 5 | No. 8 | 0.10 | (C) | 0.10 | (E) | 0.20 | 8.5 | 0.3 |
| Example 6 | No. 51 | 0.11 | (C) | 0.10 | (E) | 0.20 | 7.0 | 0.3 |
| Comparative Example 1 | A-1 | 0.10 | (B) | 0.10 | | | 5.0 | 0.2 |
| Comparative Example 2 | A-1 | 0.10 | (B) | 0.10 | (D) | 0.20 | 7.5 | 0.3 |
| Comparative Example 3 | A-1 | 0.10 | (B) | 0.10 | (E) | 0.20 | 8.0 | 0 |

TABLE A-continued

| | Copolymerization Initiator | | | | | Sensitivity to Light through BP-53 Filter | Difference in Sensitivity by Forced Aging |
| | Component (ii) | X g | Component (iii) | Y g | Co-sensitizer (S) | Z g | (stage number of step wedge) | (Δstage number of step wedge) |
|---|---|---|---|---|---|---|---|---|
| Comparative Example 4 | A-2 | 0.10 | (B) | 0.10 | (E) | 0.20 | 4.5 | 0.3 |
| Comparative Example 5 | A-1 | 0.10 | (C) | 0.10 | (E) | 0.20 | 6.5 | 0.3 |
| Comparative Example 6 | A-3 | 0.11 | (C) | 0.10 | (E) | 0.20 | 5.5 | 0.3 |

In all of the samples using component (i) of the present invention, excellent sensitivity was exhibited as compared with those using comparative compounds and the aging stability was within 0.3 stage revealing that they are stable such that no problem arises in the production.

Photosensitive materials comprising a photosensitive layer having the following composition were prepared in the same manner and examined on the sensitivity using BP-49 filter.

| | |
|---|---|
| Pentaerythritol triacrylate | 2.4 g |
| Allyl methacrylate/methacrylic acid copolymer (copolymerization molar ratio: 75/25) | 2.0 g |
| Component (i) | X g |
| Component (iii) | Y g |
| Co-sensitizer (S) | Z g |
| Fluorine-base nonionic surface active agent (F-177, produced by Dainippon Ink & Chemicals, Inc.) | 0.03 g |
| Thermal polymerization inhibitor: N-nitrosophenylhydroxylamine aluminum salt | 0.01 g |
| Pigment Dispersion Composition P.B. 15:6 (copper phthalocyanine) | 2.0 g 30 parts |
| Allyl methacrylate/methacrylic acid copolymer (copolymerization molar ratio: 83/17) | 20 parts |
| Cyclohexanone | 35 parts |
| Methoxypropyl acetate | 35 parts |
| Propylene glycol monomethyl ether | 30 parts |
| Methyl ethyl ketone | 20 g |
| Propylene glycol monomethyl ether | 20 g |

The compounds shown below were used as component component (iii) or co-sensitizer (S).

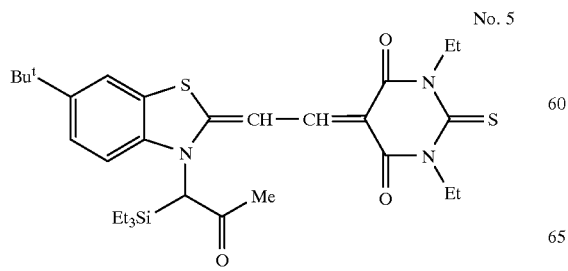

No. 5

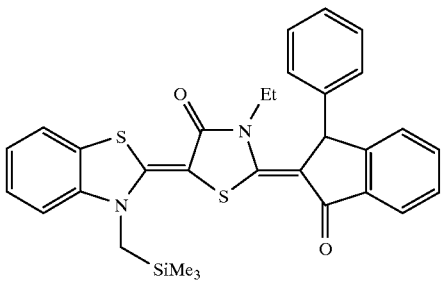

No. 7

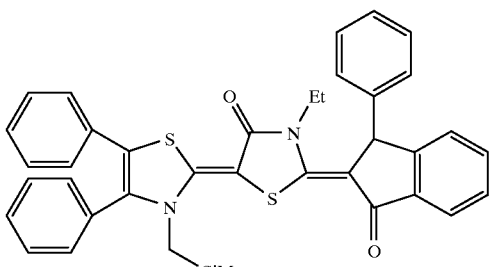

No. 8

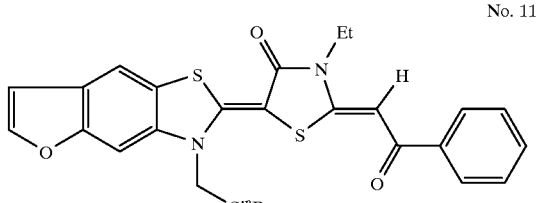

No. 11

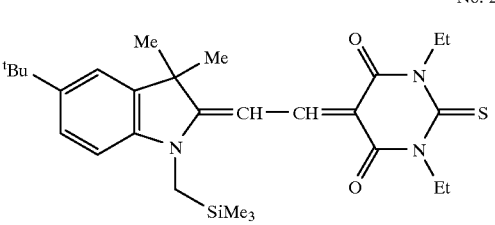

No. 20

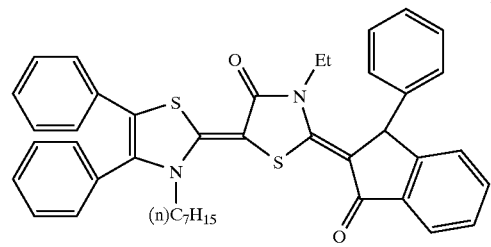
A-1
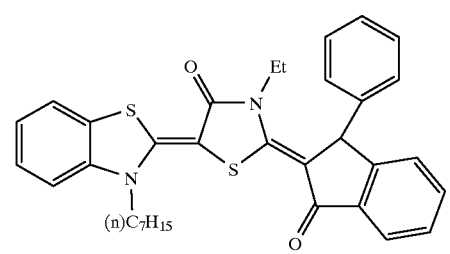
A-4
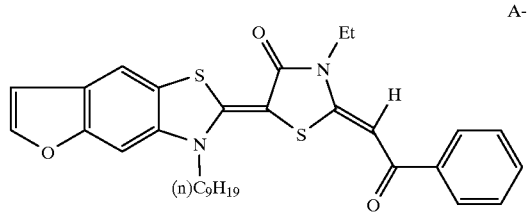
A-5
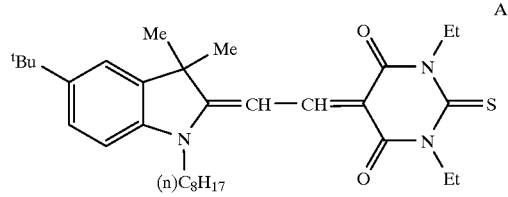
A-6
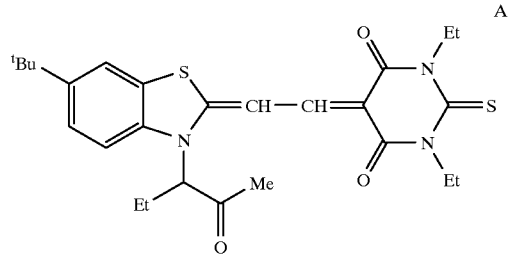
A-7
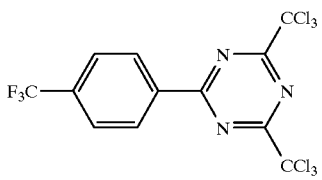
(B)
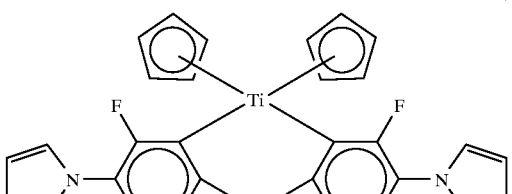
(C)
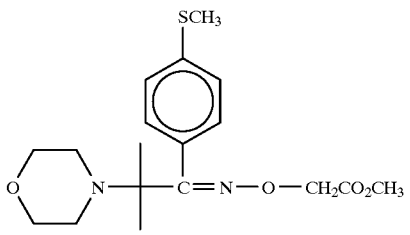
(E)
TABLE B
| | Copolymerization Initiator | | | | | | Sensitivity to Light through BP-49 Filter (stage number of step wedge) | Difference in Sensitivity by Forced Aging (Δstage number of step wedge) |
|---|---|---|---|---|---|---|---|---|
| | Component (ii) | X g | Component (iii) | Y g | Co-sensitizer (S) | Z g | | |
| Example 7 | No. 7 | 0.09 | (B) | 0.10 | — | | 7.5 | 0.3 |
| Example 8 | No. 8 | 0.10 | (B) | 0.10 | (E) | 0.20 | 9.0 | 0.2 |
| Example 9 | No. 11 | 0.10 | (B) | 0.10 | — | | 8.5 | 0.1 |
| Example 10 | No. 20 | 0.08 | (C) | 0.10 | (E) | 0.20 | 8.0 | 0.3 |
| Example 11 | No. 5 | 0.08 | (C) | 0.10 | — | | 7.5 | 0.3 |
| Comparative Example 7 | A-4 | 0.09 | (B) | 0.10 | — | | 6.0 | 0.3 |

TABLE B-continued

| | Copolymerization Initiator | | | | | Sensitivity to Light through BP-49 Filter | Difference in Sensitivity by Forced Aging |
| --- | --- | --- | --- | --- | --- | --- | --- |
| | Component (ii) | X g | Component (iii) | Y g | Co-sensitizer (S) | Z g | (stage number of step wedge) | ($\Delta$stage number of step wedge) |
| Comparative Example 8 | A-1 | 0.10 | (B) | 0.10 | (E) | 0.20 | 7.0 | 0.2 |
| Comparative Example 9 | A-5 | 0.10 | (B) | 0.10 | — | | 7.0 | 0.1 |
| Comparative Example 10 | A-6 | 0.08 | (C) | 0.10 | (E) | 0.20 | 7.0 | 0.3 |
| Comparative Example 11 | A-7 | 0.08 | (C) | 0.10 | — | | 6.5 | 0.3 |

In all of the samples using component (i) of the present invention, excellent sensitivity was exhibited as compared with those using comparative compounds and the aging stability was within 0.3 stage revealing that they are stable such that no problem arises in the production.

Photosensitive materials comprising a photosensitive layer having the following composition were prepared in the same manner and examined on the sensitivity using SC-42 filter (which cuts light having a wavelength shorter than 420 nm) manufactured by Fuji Photo Film Co., Ltd.

| | |
| --- | --- |
| Pentaerythritol triacrylate | 2.4 g |
| Benzyl acrylate/allyl methacrylate/ methacrylic acid copolymer (copolymerization molar ratio: 10/65/25) | 2.0 g |
| Component (i) | X g |
| Component (iii) | Y g |
| Co-sensitizer (S) | Z g |
| Fluorine-base nonionic surface active agent (F-177, produced by Dainippon Ink & Chemicals, Inc.) | 0.03 g |
| Thermal polymerization inhibitor: N-nitrosophenylhydroxylamine aluminum salt | 0.01 g |
| Pigment Dispersion Composition P.B. 15:6 (copper phthalocyanine) | 2.0 g 30 parts |
| Allyl methacrylate/methacrylic acid copolymer (copolymerization molar ratio: 83/17) | 20 parts |
| Cyclohexanone | 35 parts |
| Methoxypropyl acetate | 35 parts |
| Propylene glycol monomethyl ether | 80 parts |
| Methyl ethyl ketone | 20 g |
| Propylene glycol monomethyl ether | 20 g |

The compounds shown below were used as component component (iii) or co-sensitizer (S).

No. 12

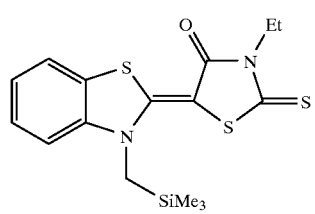

-continued

No. 13

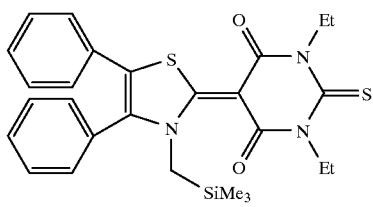

No. 27

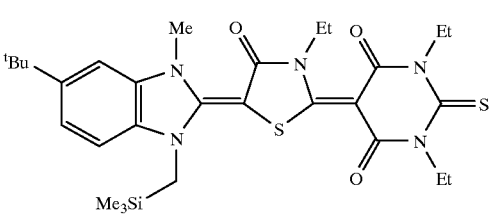

No. 37

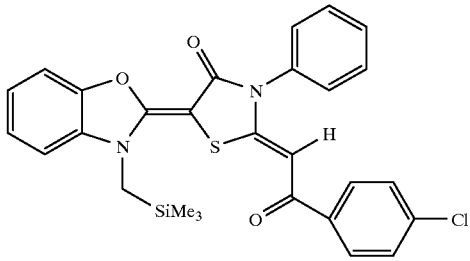

A-8

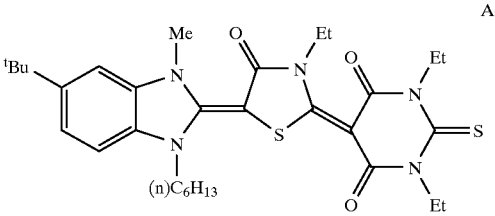

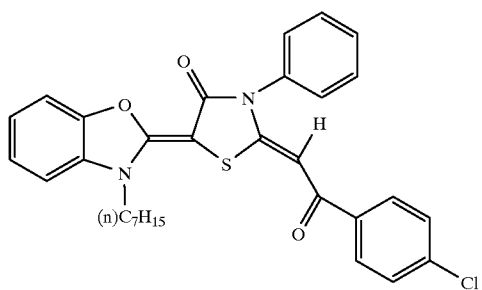
A-9

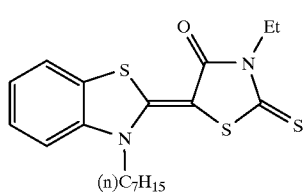
A-10

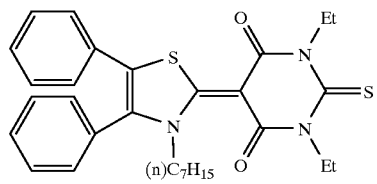
A-11

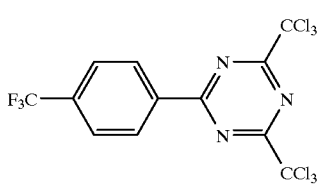
(B)

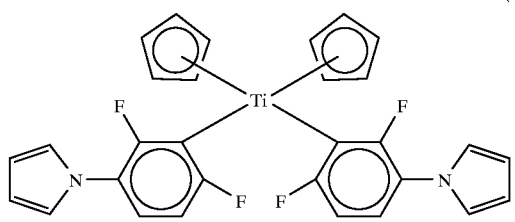
(C)

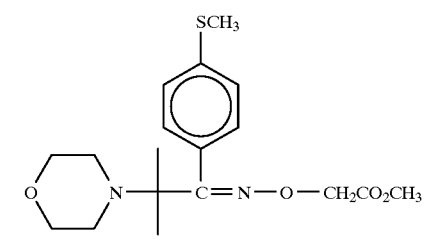
(E)

TABLE C

| | Copolymerization Initiator | | | | | | Sensitivity to Light through SC-42 Filter (stage number of step wedge) | Difference in Sensitivity by Forced Aging (Δstage number of step wedge) |
|---|---|---|---|---|---|---|---|---|
| | Component (ii) | X g | Component (iii) | Y g | Co-sensitizer (S) | Z g | | |
| Example 12 | No. 27 | 0.09 | (C) | 0.10 | (E) | 0.20 | 7.0 | 0.3 |
| Example 13 | No. 37 | 0.08 | (B) | 0.10 | (E) | 0.20 | 6.0 | 0.2 |
| Example 14 | No. 12 | 0.08 | (B) | 0.10 | — | | 7.5 | 0.2 |
| Example 15 | No. 12 | 0.08 | (B) | 0.10 | (E) | 0.20 | 8.0 | 0.2 |
| Example 16 | No. 13 | 0.09 | (B) | 0.10 | (E) | 0.20 | 9.0 | 0.2 |
| Comparative Example 12 | A-8 | 0.09 | (C) | 0.10 | (E) | 0.20 | 6.0 | 0.3 |
| Comparative Example 13 | A-9 | 0.08 | (B) | 0.10 | (E) | 0.20 | 5.0 | 0.2 |
| Comparative Example 14 | A-10 | 0.08 | (B) | 0.10 | — | | 6.5 | 0.2 |
| Comparative Example 15 | A-10 | 0.08 | (B) | 0.10 | (E) | 0.20 | 7.0 | 0.2 |
| Comparative Example 16 | A-11 | 0.09 | (B) | 0.10 | (E) | 0.20 | 8.0 | 0.3 |

In all of the samples using component (i) of the present invention, excellent sensitivity was exhibited as compared with those using comparative compounds and the aging stability was within 0.3 stage revealing that they are stable such that no problem arises in the production.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising:

(i) a compound represented by the following formula (I):

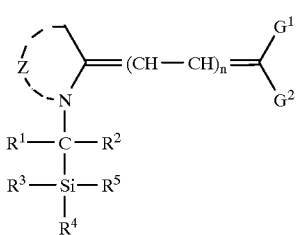

wherein $R^1$ and $R^2$, which may be the same or different, each represents a hydrogen atom, a cyano group, a substituted carbonyl group, a substituted or unsubstituted alkyl group, a substituted or unsubstituted aryl group, a substituted or unsubstituted alkenyl group or a substituted or unsubstituted alkynyl group; $R^3$, $R^4$ and $R^5$, which may be the same or different, each represents a substituted or unsubstituted alkyl group, a substituted or unsubstituted aryl group, a substituted or unsubstituted alkenyl group or a substituted or unsubstituted alkynyl group; Z represents a nonmetallic atom group necessary for forming a heterocyclic nucleus-containing an N atom; n represents an integer of 0, 1 or 2; and $G^1$ and $G^2$, which may be the same or different, each represents a hydrogen atom, a cyano group, a substituted carbonyl group, a substituted oxy group, a substituted amino group, a substituted thio group, a substituted sulfonyl group, a substituted sulfinyl group or an atomic group represented by the following formula (II):

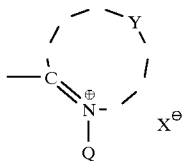

wherein Y represents a nonmetallic atom group necessary for forming a heterocyclic nucleus containing $N^+$; $X^-$ represents a counter anion to $N^+$; and Q represents a substituted or unsubstituted alkyl group, a substituted or unsubstituted aryl group, a substituted or unsubstituted alkenyl group or a substituted or unsubstituted alkynyl group, or Q may be a divalent linking group to bond to $X^-$, in which Q is a group resulting from removing a hydrogen atom from said group represented by Q, provided that $G^1$ and $G^2$ are not a hydrogen atom at the same time and that $G^1$ and $G^2$ may form a ring consisting of nonmetallic atoms together with the carbon atom to which $G^1$ and $G^2$ are bonded;

(ii) a compound containing at least one addition-polymerizable, ethylenically unsaturated bond; and (iii) a compound which generates an active radical upon irradiation of light in the presence of component (i).

2. The photopolymerizable composition of claim 1, wherein the content of component (iii) is from 0.01 to 50 parts by weight per 1 part by weight of component (i).

3. The photopolymerizable composition of claim 1, wherein component (iii) is selected from the group consisting of (a) a compound having a carbon halogen bond, (b) an aromatic onium salt compound, (c) an organic peroxide compound, (d) a thio compound, (e) a hexaarylbiimidazole compound, (f) a ketooxime ester compound, (g) a borate compound, (h) an azinium compound, (i) a metallocene compound and (j) an active ester compound.

4. The photopolymerizable composition of claim 1, futher contains a linear organic high molecular polymer.

5. The photopolymerizable composition of claim 4, wherein the weight ratio of component (ii) to the linear organic high molecular polymer is from 1/9 to 7/3.

* * * * *